United States Patent
Lee et al.

(10) Patent No.: US 12,477,877 B2
(45) Date of Patent: Nov. 18, 2025

(54) DISPLAY DEVICE AND METHOD OF FABRICATING THE SAME

(71) Applicant: Samsung Display Co., LTD., Yongin-si (KR)

(72) Inventors: Won Jun Lee, Yongin-si (KR); Dong Woo Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 422 days.

(21) Appl. No.: 18/088,925

(22) Filed: Dec. 27, 2022

(65) Prior Publication Data
US 2023/0361261 A1    Nov. 9, 2023

(30) Foreign Application Priority Data
May 4, 2022 (KR) .................. 10-2022-0055235

(51) Int. Cl.
| | |
|---|---|
| *H10H 20/857* | (2025.01) |
| *H01L 25/075* | (2006.01) |
| *H10H 20/01* | (2025.01) |
| *H10H 20/831* | (2025.01) |

(52) U.S. Cl.
CPC ....... *H10H 20/857* (2025.01); *H01L 25/0753* (2013.01); *H10H 20/01* (2025.01); *H10H 20/8312* (2025.01); *H10H 20/032* (2025.01); *H10H 20/0364* (2025.01)

(58) Field of Classification Search
CPC ........................ H10H 20/857; H01L 25/0753
See application file for complete search history.

(56) References Cited

U.S. PATENT DOCUMENTS

| | | |
|---|---|---|
| 10,580,946 B2 | 3/2020 | Im et al. |
| 10,797,212 B2 | 10/2020 | Im et al. |
| 11,088,197 B2 | 8/2021 | Kang et al. |
| 2021/0257525 A1* | 8/2021 | Ryu .................... H01L 25/0753 |
| 2021/0376045 A1* | 12/2021 | Lee ...................... H10K 59/131 |
| 2022/0037302 A1* | 2/2022 | Kim ..................... H10H 20/856 |

FOREIGN PATENT DOCUMENTS

| | | |
|---|---|---|
| KR | 10-2020-0097869 | 8/2020 |
| KR | 10-2021-0057891 | 5/2021 |
| WO | WO2020218713 | * 10/2020 |

* cited by examiner

*Primary Examiner* — Matthew L Reames
(74) *Attorney, Agent, or Firm* — Womble Bond Dickinson (US) LLP

(57) ABSTRACT

A display device comprises a first data conductive layer, a second data conductive layer on the first data conductive layer and comprising a first voltage line from which a first supply voltage is applied and a second voltage line from which a second supply voltage is applied, a first electrode on the second data conductive layer and extended in a direction and a second electrode spaced apart from the first electrode and extended in the second direction, and light-emitting elements each having an end on the first electrode and the second electrode. A first capacitor electrode and a second capacitor electrode forms a storage capacitor. The second capacitor electrode completely overlaps the light-emitting elements in a thickness direction, and partially overlaps the first electrode and the second electrode. A first alignment voltage is applied to the second capacitor electrode in a fabrication mode of the display device.

20 Claims, 21 Drawing Sheets

DISPLAY DEVICE AND METHOD OF FABRICATING THE SAME

CROSS-REFERENCE TO RELATED APPLICATION(S)

This application claims priority to and benefits of Korean Patent Application No. 10-2022-0055235 under 35 U.S.C. § 119, filed on May 4, 2022 in the Korean Intellectual Property Office, the entire contents of which are herein incorporated by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

Display devices may include a display panel such as an organic light-emitting display panel and a liquid-crystal display panel for displaying images. Among them, a light-emitting display panel may include light-emitting elements. For example, light-emitting diodes (LEDs) may include an organic light-emitting diode (OLED) using an organic material as a fluorescent material, or an inorganic light-emitting diode using an inorganic material as a fluorescent material.

SUMMARY

Aspects of the disclosure provide a display device in which a parasitic electric field can be suppressed which may be generated between an electrode that applies an alignment signal and a conductive layer under the electrode during a fabricating process.

Aspects of the disclosure also provide a method of fabricating a display device by which a parasitic electric field can be suppressed which may be generated between an electrode that applies an alignment signal and a conductive layer under the electrode during a fabricating process.

Aspects of the disclosure are not limited to the above-mentioned aspect; and other aspects of the disclosure will be apparent to those skilled in the art from the following descriptions.

According to an embodiment of the disclosure, a display device may include a semiconductor layer disposed on a first substrate and including active layers, a first gate conductive layer disposed on the semiconductor layer and including a scan line and a sensing line extended in a first direction, gate electrodes partially overlapping with the semiconductor layer, and a first capacitor electrode, a first data conductive layer disposed on the first gate conductive layer and including a data line, first and second electrodes of transistors, and a second capacitor electrode overlapping the first capacitor electrode, a second data conductive layer disposed on the first data conductive layer and including a first voltage line from which a first supply voltage may be applied and a second voltage line from which a second supply voltage may be applied, a first electrode disposed on the second data conductive layer and extended in a second direction intersecting the first direction and a second electrode spaced apart from the first electrode and extended in the second direction, and light-emitting elements each having both ends disposed on the first electrode and the second electrode. The first capacitor electrode and the second capacitor electrode may form a storage capacitor. The second capacitor electrode may completely overlap the light-emitting elements in a thickness direction, and partially overlap the first electrode and the second electrode. A first alignment voltage may be applied to the second capacitor electrode in a fabrication mode of the display device.

The transistors may include a first transistor, and the first transistor may include a first electrode electrically connected to a first end of each of the light-emitting elements, and a second electrode electrically connected to the first voltage line.

The storage capacitor may be electrically connected to a gate electrode and the first electrode of the first transistor.

The first capacitor electrode may be electrically connected to the gate electrode of the first transistor, and the second capacitor electrode may be connected to the first electrode of the first transistor so that the first alignment voltage may be applied to the first transistor.

The transistors may further include a second transistor, wherein the second transistor may include a first electrode electrically connected to the gate electrode of the first transistor, and a second electrode electrically connected to the data line.

The display device may further comprise a scan line from which a scan signal may be applied and that may be electrically connected to a gate electrode of the second transistor, and a sensing line from which a sensing signal may be applied.

The first data conductive layer may further include an initialization voltage line extended in the second direction to apply an initialization voltage.

The transistors may include a third transistor, wherein the third transistor may include a gate electrode electrically connected to the sensing line, a first electrode electrically connected to the first end of each of the light-emitting elements, and a second electrode electrically connected to the initialization voltage line.

A second alignment voltage may be applied to the first electrode and the second electrode in the fabrication mode.

The first electrode may be electrically connected to the second voltage line in the fabrication mode.

The second electrode may be electrically connected to the second voltage line in the fabrication mode.

The display device may further include a first interlayer dielectric layer between the first data conductive layer and the second data conductive layer, and a first planarization layer disposed between the second data conductive layer and the first and second electrodes.

The first electrode and the second electrode may be electrically connected to the second voltage line through contact holes penetrating the first planarization layer.

The display device may further include a third electrode disposed on a same layer as the first electrode and extended in the second direction, wherein the third electrode may be disposed between the first electrode and the second electrode in a plan view, and a same alignment voltage as an alignment voltage of the first electrode may be applied to the third electrode.

The third electrode may include patterns spaced apart from one another in the first direction.

According to an embodiment of the disclosure, a method of fabricating a display device may be provided. The method may include preparing a target substrate. The target substrate may include a first substrate, a semiconductor layer disposed on the first substrate and including active layers, a first gate conductive layer disposed on the semiconductor layer and including a scan line and a sensing line extended in a first direction, gate electrodes partially overlapping the semiconductor layer, and a first capacitor electrode, a first data conductive layer disposed on the first gate conductive layer and including a data line, first and second electrodes of transistors, and a second capacitor electrode overlapping the first capacitor electrode, a second data conductive layer disposed on the first data conductive layer and including a first voltage line from which a first supply voltage may be applied and a second voltage line from which a second supply voltage may be applied, and a first electrode disposed on the second data conductive layer and extended in a second direction intersecting the first direction and a second electrode spaced apart from the first electrode and extended in the second direction. The method may include aligning light-emitting elements such that ends may be disposed on the first electrode and the second electrode of the target substrate. The first capacitor electrode and the second capacitor electrode may form a storage capacitor. The second capacitor electrode may completely overlap the light-emitting elements in a thickness direction, and may partially overlap the first electrode and the second electrode. The aligning of the light-emitting elements includes applying a first alignment voltage to the second capacitor electrode.

The aligning of the light-emitting elements may include applying a second alignment voltage to the first electrode and the second electrode.

The first electrode may be electrically connected with the second voltage line while the light-emitting elements may be aligned.

The second electrode may be electrically connected with the second voltage line while the light-emitting elements may be aligned.

The display device may include a third electrode disposed on a same layer as the first electrode and extended in the second direction. The third electrode may be disposed between the first electrode and the second electrode in a plan view. The aligning of the light-emitting elements may include applying a same alignment voltage as that of the first electrode to the third electrode.

According to an embodiment of the disclosure, it may be possible to suppress a parasitic electric field which may be generated between an electrode that applies an alignment signal and a conductive layer under the electrode during processes of fabricating a display device.

It should be noted that effects of the disclosure are not limited to those described above and other effects of the disclosure will be apparent to those skilled in the art from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
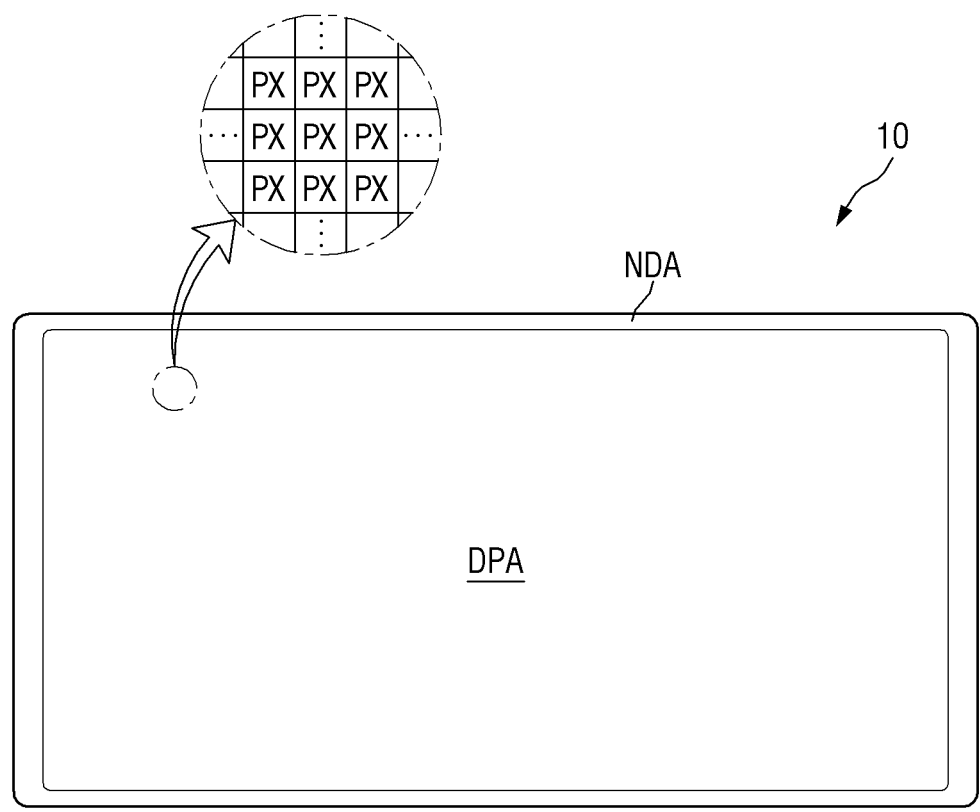
FIG. 1 is a plan view schematically showing a display device according to an embodiment of the disclosure.

FIG. 1 is a schematic plan view of a display device according to an embodiment of the disclosure.

As used herein, the terms "above," "top" and "upper surface" may refer to the upper side of a display device 10, i.e., the side indicated by the arrow in the third direction DR3, whereas the terms "below," "bottom" and "lower surface" may refer to the opposite side in the third direction DR3. As used herein, the terms "left," "right," "upper" and "lower" sides may indicate relative positions. For example, the "left side" may refer to the opposite of the first direction DR1, the "right side" may refer to the side indicated by the arrow of the first direction DR1, the "upper side" may refer to the side indicated by the arrow of the second direction DR2, and the "lower side" may refer to the opposite of the second direction DR2.

Referring to FIG. 1, the display device 10 displays a moving image or a still image. A display device 10 may refer to any electronic device that provides a display screen. For example, the display device 10 may include a television set, a laptop computer, a monitor, an electronic billboard, an Internet of Things device, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the disclosure is not limited thereto. Other embodiments may include other types of display panels.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc. The shape of a display area DPA of the display device 10 may also be similar to the overall shape of the display device 10. FIG. 1 shows the display device 1 in the shape of a rectangle with longer horizontal sides and the display area DPA.

The display device 10 may include a display area DPA and a non-display area NDA. In the display area DPA, images can be displayed. In the non-display area NDA, images may not be displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged in a matrix. The shape of each pixel PX may be, but is not limited to, a rectangle or a square in plan view. Each pixel may have a diamond shape having sides inclined with respect to a direction. The pixels PX may be arranged in stripes or a PenTile® pattern alternately. Each of the pixels PX may include at least one light-emitting element ED that emits light of a particular wavelength band.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
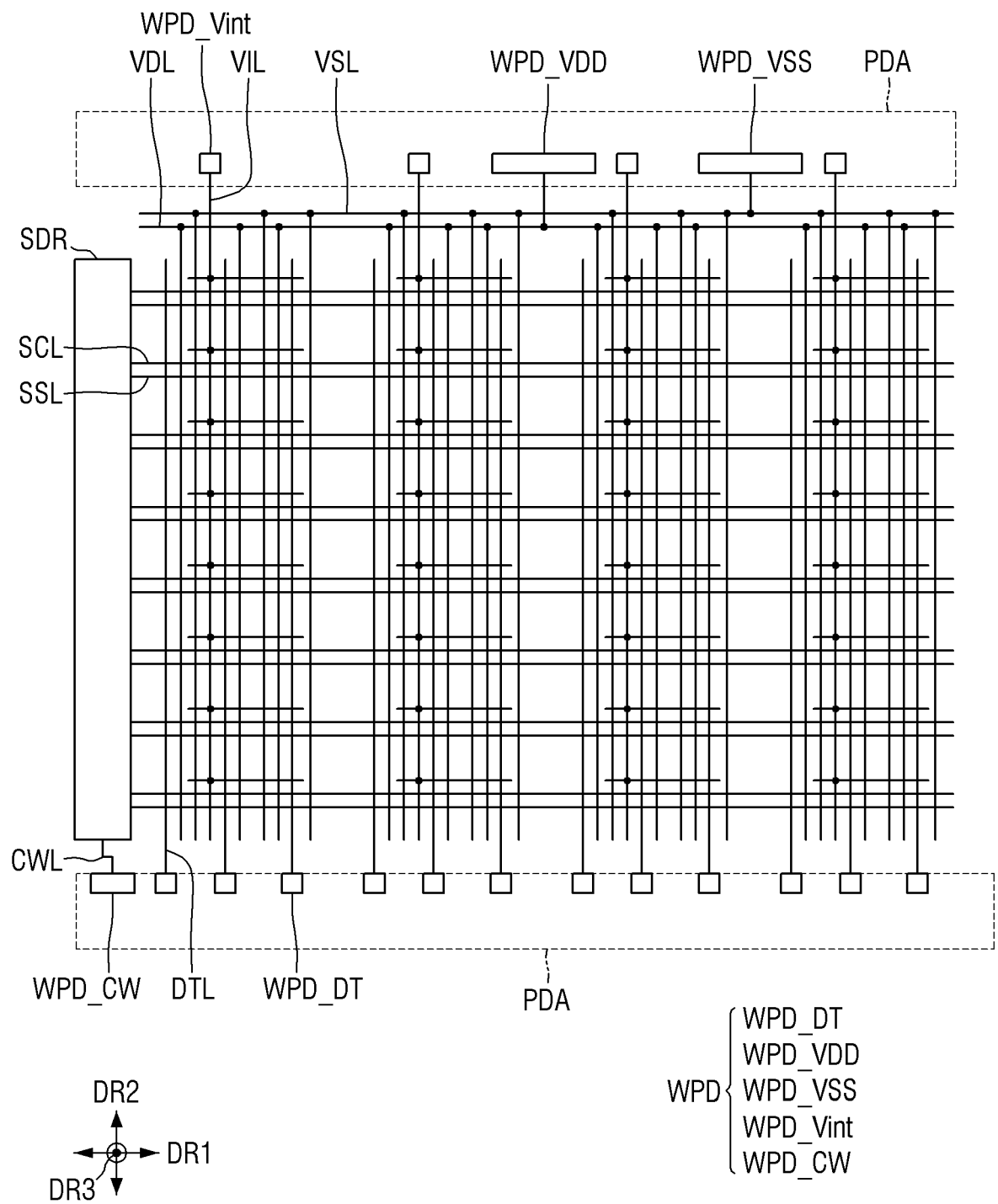
FIG. 2 is a diagram schematically showing lines included in a display device according to an embodiment of the disclosure.

FIG. 2 is a diagram schematically showing lines included in a display device according to an embodiment of the disclosure.

Referring to FIG. 2, the display device 10 may include lines. The lines may include a scan line SCL, a sensing line SSL, a data line DTL, an initialization voltage line VIL, a first voltage line VDL, a second voltage line VSL, etc. Also, although not shown in the drawings, other lines may be further disposed in the display device 10.

The scan line SCL and the sensing line SSL may be extended in the first direction DR1. The scan line SCL and the sensing line SSL may be connected to a scan driver SDR. The scan driver SDR may include a driving circuit. The scan driver SDR may be disposed on, but is not limited to, a side of the display area DPA in the first direction DR1. The scan driver SDR may be connected to a signal connection line CWL, and at least one end of the signal connection line CWL may form a pad WPD_CW on the non-display area NDA to be connected to an external device.

As used herein, when an element is referred to as being "connected" or "coupled" to another element, it can be directly connected or coupled to the element or intervening elements may be present. In addition, such elements may be understood as a single integrated element and thus one portion thereof is connected to another portion. It will be understood that the terms "connected to" or "coupled to" may include a physical or electrical connection or coupling.

The data line DTL and the initialization voltage line VIL may be extended in a second direction DR2 crossing (intersecting) the first direction DR1. The initialization voltage line VIL may further include branches as well as the portion extended in the second direction DR2. Each of the first voltage line VDL and the second voltage line VSL may also include portions extended in the second direction DR2 and portions connected thereto and extended in the first direction DR1. The first voltage line VDL and the second voltage line VSL may have, but are not limited to, a mesh structure. Although not shown in the drawings, each of the pixels PX of the display device 10 may be connected to at least one data line DTL, the initialization voltage line VIL, the first voltage line VDL, and the second voltage line VSL.

The data line DTL, the initialization voltage line VIL, the first voltage line VDL and the second voltage line VSL may be electrically connected to one or more wire pads WPD. The wire pads WPD may be disposed in the non-display areas NDA. According to an embodiment of the disclosure, a wire pad WPD_DT of the data line DTL (hereinafter referred to as a data pad) may be disposed in the pad area PDA on a side of the display area DPA in the second direction DR2, and a wire pad WPD_Vint of the initialization voltage line VIL (hereinafter referred to as an initialization voltage pad), a wire pad WPD VDD of the first voltage line VDL (hereinafter referred to as a first power pad), and a wire pad WPD_VSS of the second voltage line VSL (hereinafter referred to as a power pad) may be disposed in the pad area PDA located on another side of the display area DPA in the second direction DR2. As another example, the data pad WPD_DT, the initialization voltage pad WPD_Vint and the first supply voltage pad WPD VDD and the second supply voltage pad WPD_VSS may all be disposed in the same area, e.g., in the non-display area NDA on the upper side of the display area DPA. External devices may be mounted on the wire pads WPD. External devices may be mounted on the wire pads WPD by an anisotropic conductive film, ultrasonic bonding, etc.

Each of the pixels PX or sub-pixels PXn of the display device 10 may include a pixel driving circuit, where n is an integer of 1 to 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels PXn of the display device 10 may have a 3T1C structure, i.e., a pixel driving circuit includes three transistors and one capacitor. In the following description, the pixel driving circuit having the 3T1C structure will be described as an example. It is, however, to be understood that the disclosure is not limited thereto. A variety of modified pixel structures may be employed such as a 2T1C structure, a 7T1C structure and a 6T1C structure.

Figure 3:
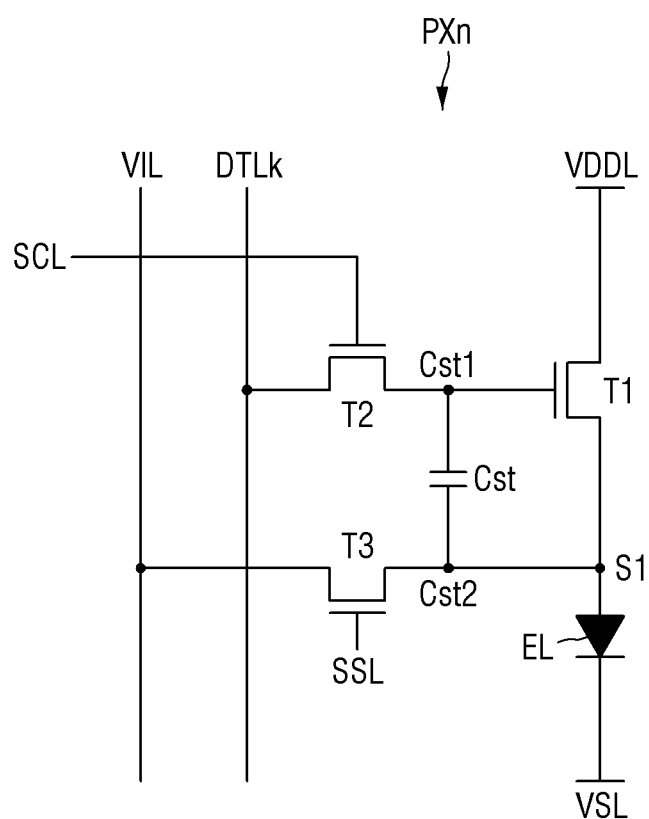
FIG. 3 is a schematic circuit diagram of a sub-pixel according to an embodiment of the disclosure.

FIG. 3 is a schematic circuit diagram of a sub-pixel according to an embodiment of the disclosure.

Referring to FIG. 3, each of the sub-pixels PXn of the display device 10 according to an embodiment may include three transistors T1, T2 and T3 and one storage capacitor Cst in addition to a light-emitting diode EL.

The light-emitting diode EL may emit light in proportion to the current supplied through the first transistor T1. The light-emitting diode EL may include a first electrode, a second electrode, and at least one light-emitting element disposed therebetween. The light-emitting element may emit light in a particular wavelength range by an electric signal transmitted from the first electrode and the second electrode.

An end of the light-emitting diode EL may be connected to a source electrode of the first transistor T1, and another end thereof may be connected to the second voltage line VSL from which a low-level voltage (hereinafter referred to as a second supply voltage) lower than a high-level voltage (hereinafter referred to as a first supply voltage) of the first voltage line VDL is applied.

The first transistor T1 may adjust a current flowing from the first supply voltage line VDDL from which the first supply voltage is supplied to the light-emitting diode EL according to the voltage difference between a gate electrode and the source electrode. For example, the first transistor T1 may be a driving transistor for driving the light-emitting diode EL. The gate electrode of the first transistor T1 may be connected to a source electrode of the second transistor T2, the source electrode thereof may be connected to the first electrode of the light-emitting diode EL, and the drain electrode thereof may be connected to the first voltage line VDL from which the first supply voltage is applied.

The second transistor T2 may be turned on by a scan signal of the scan line SCL to connect the data lines DTL; DRLk, DRL(k+1) with the gate electrode of the first transistor T1. The gate electrode of the second transistor T2 may be connected to the scan line SCL, the source electrode thereof may be connected to the gate electrode of the first transistor T1, and the drain electrode thereof may be connected to the kth data line DTLk, where k is an integer equal to or greater than one.

The third transistor T3 may be turned on by a sensing signal of the sensing line SSL to connect the initialization voltage line VIL with an end of the light-emitting diode EL. The gate electrode of the third transistor T3 may be connected to the sensing line SSL, the drain electrode thereof may be connected to the initialization voltage line VIL, and the source electrode thereof may be connected to an end of the light-emitting diode EL or the source electrode of the first transistor T1.

The source electrode and the drain electrode of each of the transistors T1, T2 and T3 are not limited to those described above. They may be connected in the opposite way.

The storage capacitor Cst may be formed between the gate electrode and the source electrode of the first transistor T1. The storage capacitor Cst may store a voltage difference between the gate voltage and the source voltage of the first transistor T1.

Each of the transistors T1, T2 and T3 may be formed as a thin-film transistor. Although each of the transistors T1, T2 and T3 implemented as an n-type MOSFET (metal oxide semiconductor field effect transistor) in the example shown in FIG. 3, the disclosure is not limited thereto. That is to say, each of the transistors T1, T2 and T3 may be implemented as a p-type MOSFET, or some of the transistors T1, T2 and T3 may be implemented as n-type MOSFETs while others may be implemented as p-type MOSFETs.

Hereinafter, the structure of one pixel PX of the display device 10 according to an embodiment will be described in detail with reference to other drawings.

Figure 4:
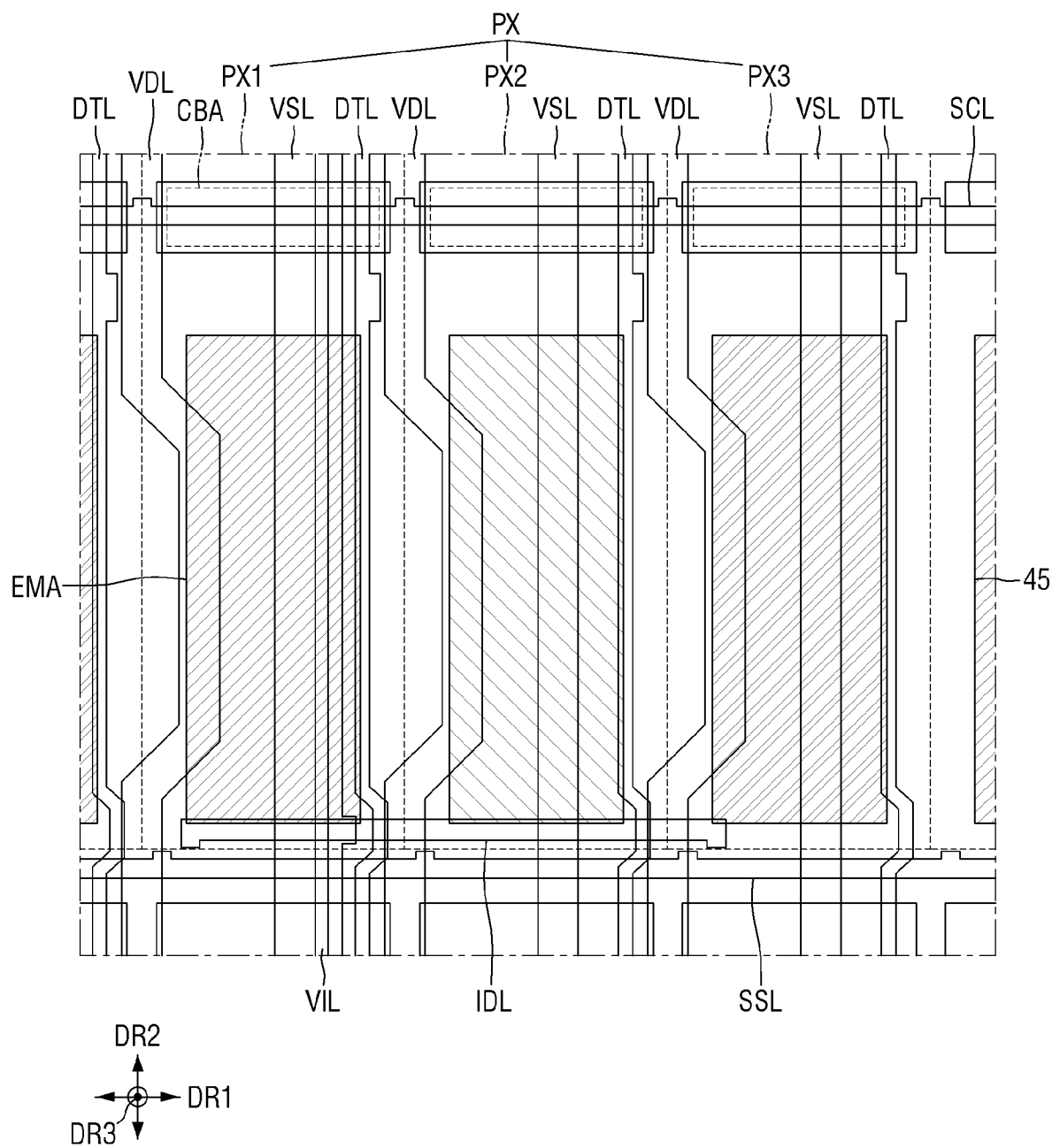
FIG. 4 is a plan view schematically showing lines arranged in a pixel of a display device according to an embodiment of the disclosure.

FIG. 4 is a plan view schematically showing lines arranged in a pixel of a display device according to an embodiment of the disclosure. FIG. 4 shows schematic shapes of lines and the second bank 45 disposed in each pixel PX of the display device 10 but does not show the elements disposed in the emission area EMA of each sub-pixel PXn and some conductive layers disposed thereunder.

In the following drawings, the both sides in the first direction DR1 may be referred to as the left side and right side, respectively, and the both sides in the second direction DR2 may be referred to as the upper side and the lower side, respectively.

Referring to FIG. 4, each of the pixels PX of the display device 10 may include sub-pixels PXn, where n may be an integer from one to three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. It is, however, to be understood that the disclosure is not limited thereto. All the sub-pixels PXn may emit light of the same color.

Each of the sub-pixels PXn of the display device 10 may include an emission area EMA and a non-emission area (not shown). In the emission area EMA, the light-emitting element 30 (see FIG. 7) may be disposed to emit light of a particular wavelength. In the non-emission area, no light-emitting element ED may be disposed and light emitted from the light-emitting element ED may not reach and thus no light exits therefrom. The emission area may include an area in which the light-emitting elements ED are disposed, and may include an area adjacent to the light-emitting elements ED where lights emitted from the light-emitting element ED exit.

It is, however, to be understood that the disclosure is not limited thereto. The emission area may also include an area in which light emitted from the light-emitting element ED is reflected or refracted by other elements to exit. The light-emitting elements ED may be disposed in each of the sub-pixels PXn, and the emission area may include the area where the light-emitting elements are disposed and the adjacent area.

Each of the sub-pixels PXn may further include a cut area CBA disposed in the non-emission area. The cut area CBA may be disposed on a side of the emission area EMA in the second direction DR2. The cut area CBA may be disposed between the emission areas EMA of neighboring sub-pixels PXn in the second direction DR2. In the display area DPA of the display device 10, multiple emission areas EMA and cut areas CBA may be arranged. For example, the emission areas EMA and the cut areas CBA may be arranged repeatedly in the first direction DR1, and may be arranged alternately in the second direction DR2. The spacing between the cut areas CBA in the first direction DR1 may be smaller than the spacing between the emission areas EMA in the first direction DR1. As will be described later, the second bank 45 may be disposed between the cut areas CBA and the emission areas EMA, and the distance between them may vary depending on the width of the second bank 45. The light-emitting elements ED may not be disposed in the cut areas CBA and thus no light exits therefrom. The electrodes disposed in each of the sub-pixels PXn may be partially disposed in the cut area CBA. The electrodes disposed in each of the sub-pixels PXn may be disposed separately from each other in the cut area CBA.

The second bank 45 may be disposed in a lattice pattern on the entire surface of the display area DPA including portions extended in the first direction DR1 and the second direction DR2 in plan view. The second bank 45 may be disposed along the border of each of the sub-pixels PXn to distinguish adjacent sub-pixels PXn from one another. The second bank 45 may be disposed to surround the emission area EMA and the cut area CBA disposed in each of the sub-pixels PXn to distinguish them. The part of the second bank 45 extended in the second direction DR2 may have a larger width between the emission areas EMA than between the cut areas CBA. Accordingly, the distance between the cut areas CBA may be smaller than the distance between the emission areas EMA.

Multiple lines may be disposed in each pixel PX and sub-pixels PXn of the display device 10. For example, the display device 10 may include an initialization voltage distribution line IDL disposed across several sub-pixels PXn, in addition to the scan line SCL and the sensing line SSL extended in the first direction DR1. The display device 10 includes a data line DTL, an initialization voltage line VIL, a first voltage line VDL, and a second voltage line VSL, which are extended in the second direction DR2.

The scan line SCL may be extended in the first direction DR1 and may be disposed across the sub-pixels PXn arranged in the first direction DR1. A number of scan lines SCL are spaced apart from one another in the second direction DR2 throughout the entire display area DPA. The scan lines SCL may be disposed on the upper side of the center of each pixel PX or sub-pixels PXn. The scan line SCL may be electrically connected to a gate electrode of the second transistor T2, and may apply a scan signal to the second transistor T2.

Similarly, the sensing line SSL may be extended in the first direction DR1 and may be disposed across the sub-pixels PXn arranged in the first direction DR1. A number of sensing lines SSL are spaced apart from one another in the second direction DR2 throughout the entire display area DPA. The sensing lines SSL may be disposed on the lower side of the center of each pixel PX or sub-pixels PXn. The sensing line SSL may be electrically connected to a gate electrode of the third transistor T3, and may apply a sensing signal to the third transistor T3.

The initialization voltage distribution line IDL may be disposed in each pixel PX and may be extended across three sub-pixels PXn. The initialization voltage distribution line IDL may be disposed above the sensing line SSL and may be extended in the first direction DR1. The initialization voltage distribution line IDL may be electrically connected to the initialization voltage line VIL to transfer the initialization voltage Vint applied to each pixel PX to each of the sub-pixels PXn. For example, the initialization voltage distribution line IDL may be in direct contact with the initialization voltage line VIL through a contact hole CT10 (see FIG. 5). The initialization voltage distribution line IDL may be electrically connected to the drain electrode of the third transistor T3 of each of the sub-pixels PXn. The initialization voltage distribution line IDL may apply the initialization voltage applied from the initialization voltage line VIL to the third transistor T3.

The scan line SCL, the sensing line SSL, and the initialization voltage distribution line IDL may be formed as a first gate conductive layer to be described later. The first gate conductive layer may further include more conductive layers in addition to the above-described lines.

The data line DTL (e.g., DTL1, DTL2 in FIG. 5) maybe extended in the second direction DR2 and may be disposed across the sub-pixels PXn arranged in the second direction DR2. A number of data lines DTL may be spaced apart from one another in the first direction DR1 throughout the entire display area DPA. The data line DTL may be disposed on the right side in each of the sub-pixels PXn. A data line DTL that transmits a data signal to a sub-pixel PXn may be disposed on the right side of another adjacent sub-pixel PXn in the first direction DR1, and a data line DTL disposed on the right side of the sub-pixel PXn may transmit a data signal to another sub-pixel PXn. In other words, the data line DTL may not be disposed in the area occupied by the sub-pixel PXn to which it is connected. It is, however, to be understood that the disclosure is not limited thereto. The data line DTL may be electrically connected to a drain electrode of the second transistor T2, and may apply a data signal to the second transistor T2.

The initialization voltage line VIL may be extended in the second direction DR2 and may be disposed across the sub-pixels PXn arranged in the second direction DR2. A number of initialization voltage lines VIL may be spaced apart from one another in the first direction DR1 throughout the entire display area DPA. The initialization voltage line VIL may be disposed in each of the three sub-pixels PXn or one pixel PX. For example, the initialization voltage line VIL may be disposed on the left side of the data line DTL connected to one of the sub-pixels PXn. Although the initialization voltage line VIL is disposed on the left side of the data line DTL disposed in the area occupied by the first sub-pixel PX1 as the data line DTL connected to the second sub-pixel PX2 in the example shown in the drawings, the disclosure is not limited thereto. The initialization voltage line VIL may be electrically connected to the initialization voltage distribution line IDL to transfer the initialization voltage to each of the sub-pixels PXn. The initialization voltage line VIL may be electrically connected to the drain electrode of the third transistor T3, and may apply an initialization voltage to the third transistor T3.

The data line DTL and the initialization voltage line VIL may be formed as a first data conductive layer to be described later. The first data conductive layer may further include more conductive layers in addition to the above-described lines and wirings.

The first voltage line VDL and the second voltage line VSL may be extended in the second direction DR2 and may be disposed across multiple sub-pixels PXn adjacent to each other in the second direction DR2. The first voltage lines VDL and second voltage lines VSL may be spaced apart from one another in the first direction DR1 throughout the entire display area DPA. The first voltage line VDL and the second voltage line VSL may be disposed between the data lines DTL in plan view. The first voltage line VDL may be disposed on the left side of the center of each of the sub-pixels PXn, and the second voltage line VSL may be disposed on the right side of the center of each of the sub-pixels PXn. It should be noted that the first voltage line VDL extended in the second direction DR2 may be partially bent. For example, the first voltage line VDL may include a portion that is bent toward the second voltage line VSL in addition to the portion extended from the upper side to the lower side of each of the sub-pixels PXn. Accordingly, the distance between the first voltage line VDL and the second voltage line VSL may vary depending on the position within each of the sub-pixels PXn.

The first voltage line VDL may be electrically connected to the drain electrode of the first transistor T1 and may apply the first supply voltage to the first transistor T1. The second voltage line VSL may be electrically connected to the second electrode of the light-emitting diode EL to apply the second supply voltage to the light-emitting diode. The first voltage line VDL and the second voltage line VSL may be formed as a second data conductive layer to be described later.

Figure 5:
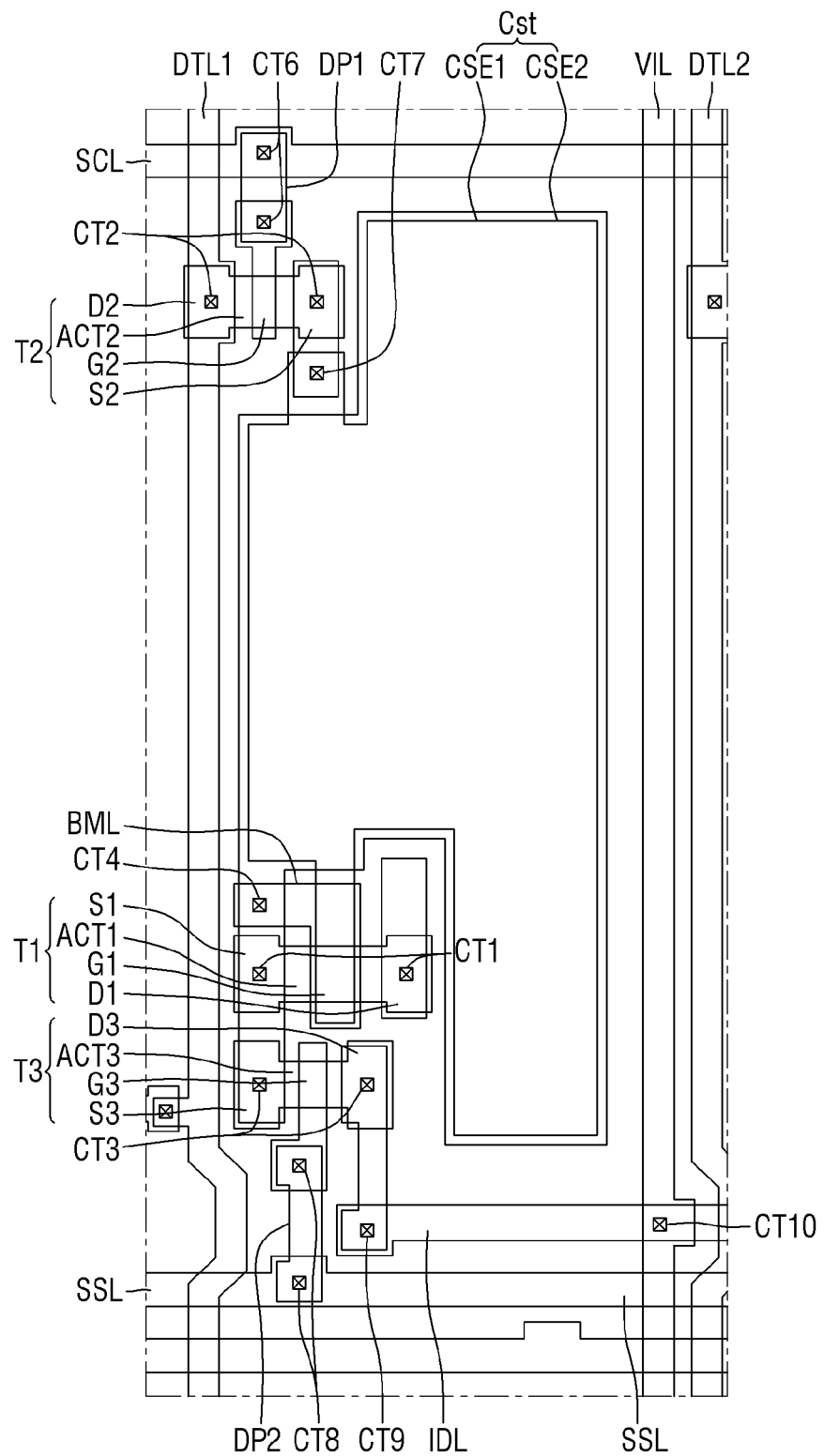
FIG. 5 is a view schematically showing an arrangement of multiple conductive lines included in a sub-pixel of a display device according to an embodiment of the disclosure.
Figure 6:
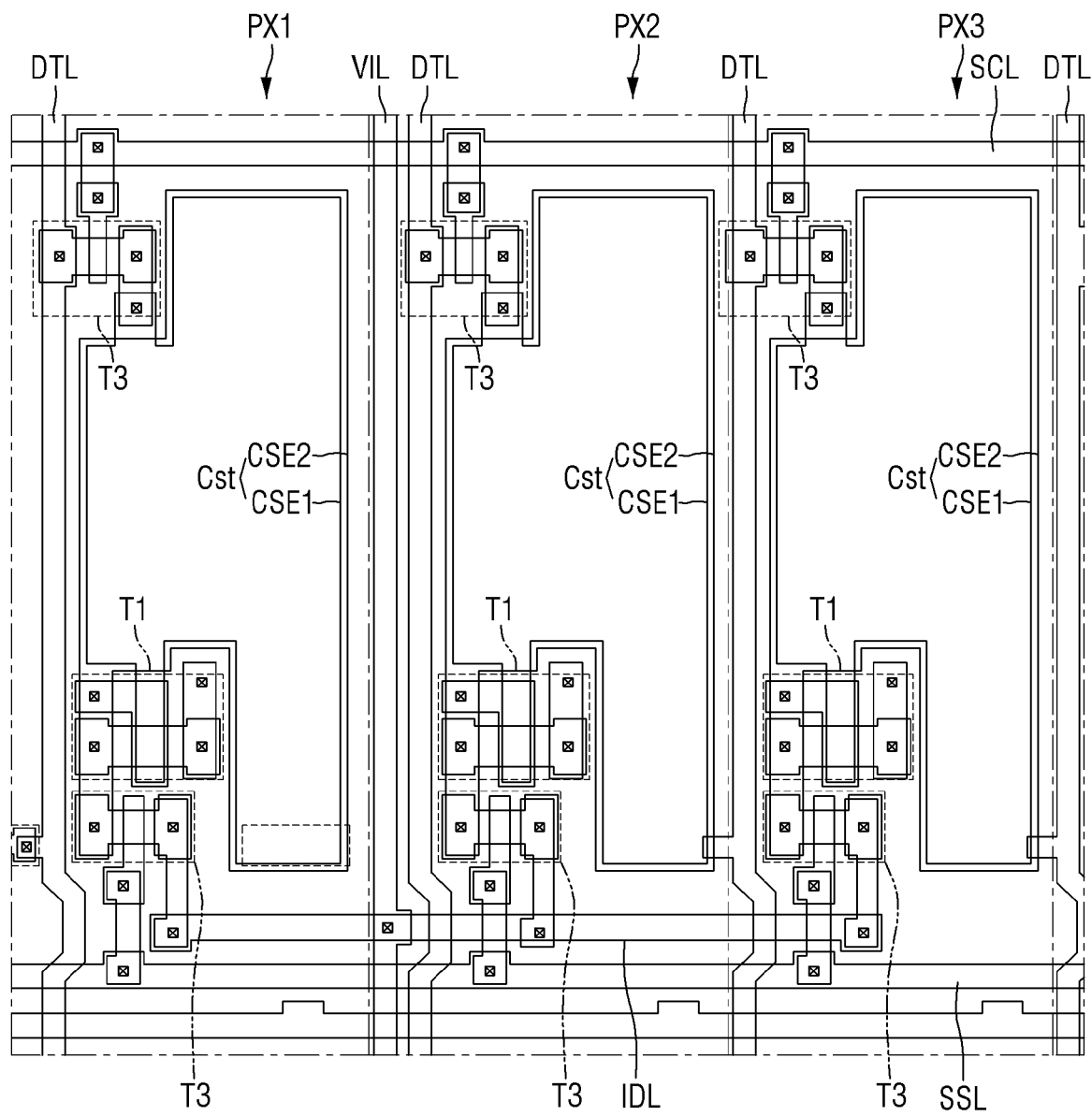
FIG. 6 is a view schematically showing an arrangement of multiple conductive lines included in a pixel of a display device according to an embodiment of the disclosure.
Figure 7:
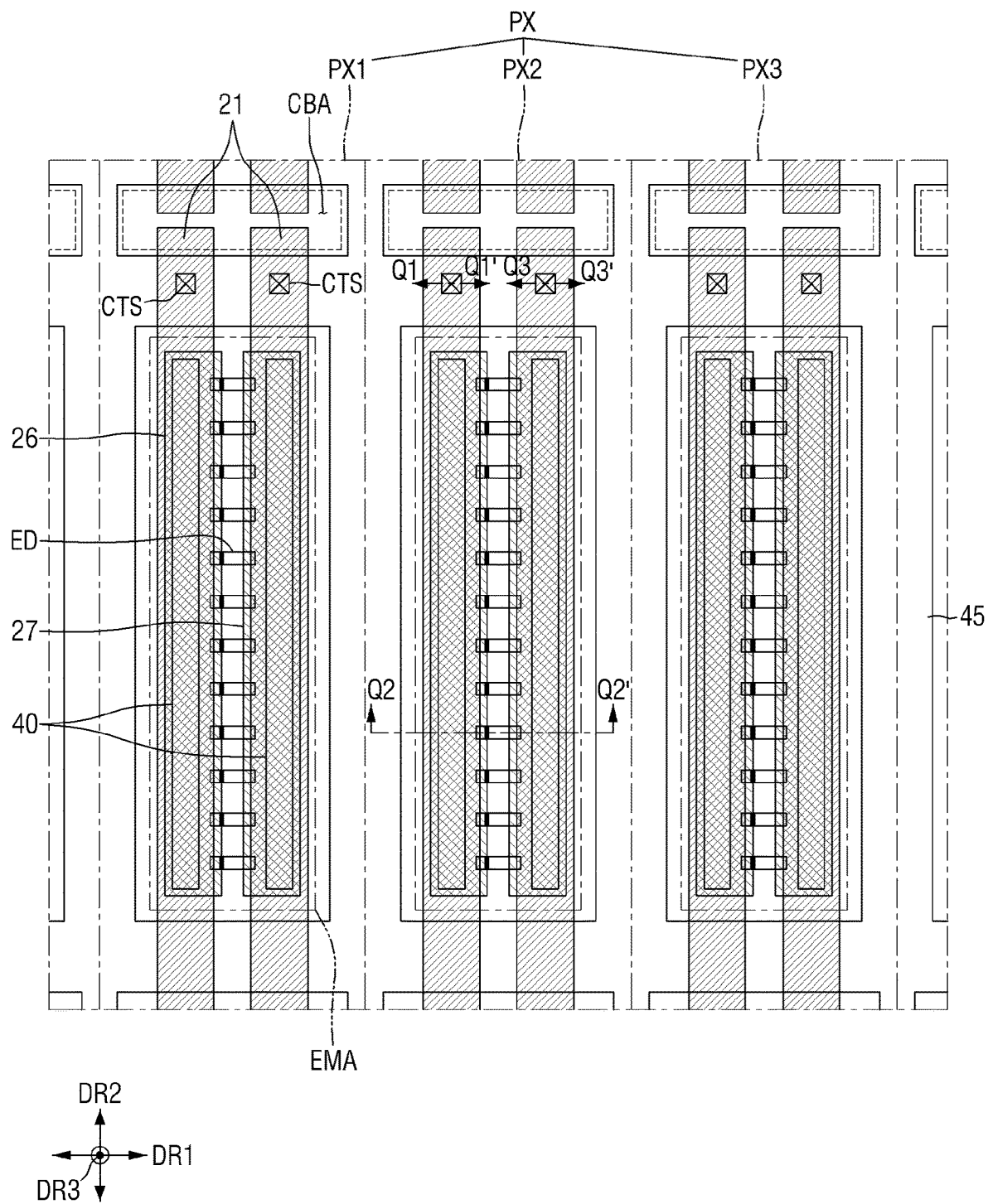
FIG. 7 is a plan view schematically showing multiple electrodes and banks included in a pixel of a display device according to an embodiment.
Figure 8:
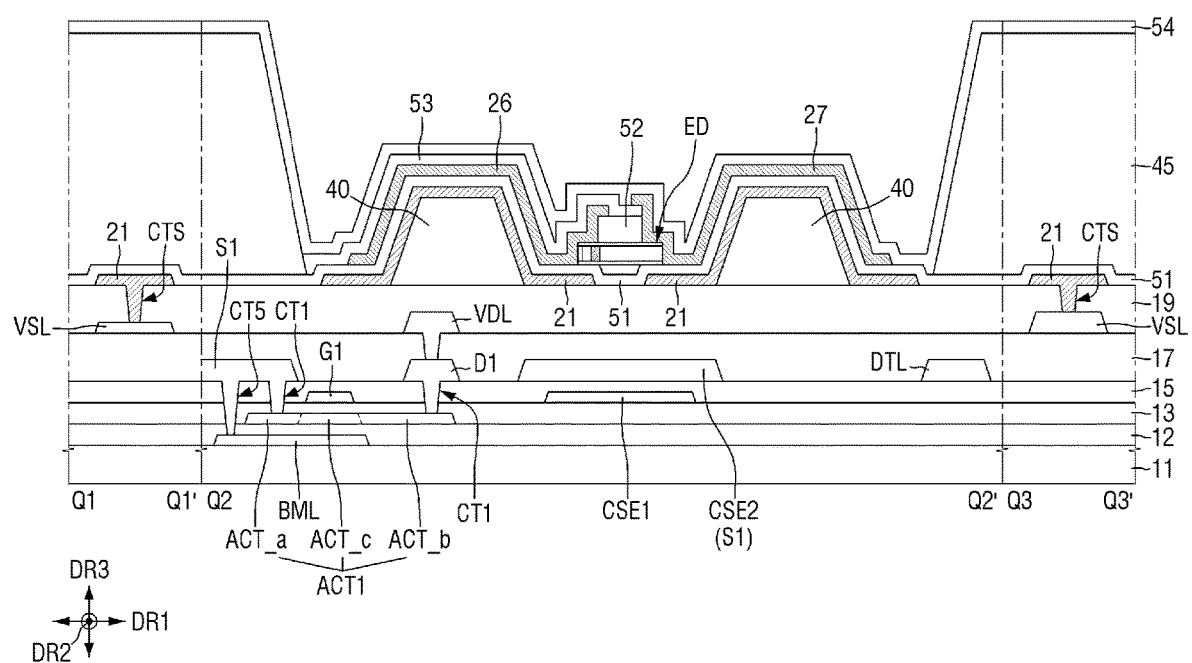
FIG. 8 is a schematic cross-sectional view taken along lines Q1-Q1', Q2-Q2' and Q3-Q3' of FIG. 7.

FIG. 5 is a view schematically showing an arrangement of multiple conductive lines included in a sub-pixel of a display device according to an embodiment of the disclosure. FIG. 6 is a view schematically showing an arrangement of multiple conductive lines included in a pixel of a display device according to an embodiment of the disclosure. FIG. 7 is a plan view schematically showing multiple electrodes and banks included in a pixel of a display device according to an embodiment. FIG. 8 is a schematic cross-sectional view taken along lines Q1-Q1', Q2-Q2' and Q3-Q3' of FIG. 7.

FIG. 5 shows a layout of the conductive layers, the lines connected thereto and transistors disposed in the first sub-pixel PX1 as the circuit element layer disposed in each of the sub-pixels PXn. FIG. 6 shows a layout of the conductive layers, the lines connected thereto, and transistors disposed in a pixel PX. In FIGS. 5 and 6, the first voltage line VDL and the second voltage line VSL are not depicted. The sub-pixels PXn shown in FIG. 6 are distinguished from one another not by the areas occupied by the sub-pixels PXn but by the circuit element layers connected to the light-emitting diodes EL disposed in the sub-pixels PXn.

FIG. 7 shows, as a display element layer disposed in each of the pixels PX, multiple banks 40 and 45 and contact electrodes 26 and 27, in addition to the electrodes 21 and the light-emitting elements ED forming the light-emitting diodes EL. FIG. 8 shows a cross section from an end to the opposite end of a light-emitting element ED in addition to the first transistor T1.

Referring to FIGS. 5 to 8 in conjunction with FIG. 4, the display device 10 may include a circuit element layer and a display element layer. In the display element layer, a first electrode 21 and a second electrode 21 may be disposed, including the light-emitting element ED of the light-emitting diode EL. In the circuit element layer, lines may be disposed, including pixel circuit elements for driving the light-emitting diode EL. For example, the circuit element layer may include the scan line SCL, the sensing line SSL, the data line DTL, the initialization voltage line VIL, the first voltage line VDL, the second voltage line VSL, as well as transistors T1, T2 and T3.

Specifically, the display device 10 may include a first substrate 11 on which the circuit element layer and the display element layers are disposed. The first substrate 11 may be an insulating substrate, and may be made of an insulating material such as glass, quartz and a polymer resin. The first substrate 11 may be either a rigid substrate or a flexible substrate that can be bent, folded, or rolled.

A light-blocking layer BML, may be disposed on the first substrate 11. The light-blocking layer BML may overlap a first active layer ACT1 of a first transistor T1 of the display device 10. The light-blocking layer BML may include a material that blocks light, and thus can prevent light from entering the first active layer ACT1 of the first transistor T1. For example, the light-blocking layer BML may be formed of an opaque metal material that blocks light transmission. It is, however, to be understood that the disclosure is not limited thereto. In some implementations, the light-blocking layer BML may be eliminated or may overlap the active layer of any one of other transistors T1, T2 and T3.

The buffer layer 12 may be disposed entirely on the first substrate 11, including the light-blocking layer BML. The buffer layer 12 may be formed on the first substrate 11 in order to protect the transistors T1, T2 and T3 from moisture permeating through the first substrate 11 that is susceptible to moisture permeation, to provide a flat surface. The buffer layer 12 may be formed of multiple inorganic layers stacked on one another alternately. For example, the buffer layer 12 may be made up of multiple layers in which inorganic layers including at least one of a silicon oxide (SiOx), a silicon nitride (SiNx) and silicon oxynitride (SiON) are stacked on one another alternately.

The semiconductor layer is disposed on the buffer layer 12. The semiconductor layer may include active layers ACT1, ACT2 and ACT3 of the transistors T1, T2 and T3. The first active layer ACT1 of the first transistor T1 may be disposed adjacent to and under the center of each of the sub-pixels PXn. The second active layer ACT2 of the second transistor T2 may be disposed on the upper side of the center of each of the sub-pixels PXn, and the third active layer ACT3 of the third transistor T3 may be disposed on the lower side of the first active layer ACT.

According to an embodiment of the disclosure, the semiconductor layer may include polycrystalline silicon, monocrystalline silicon, an oxide semiconductor, etc. The polycrystalline silicon may be formed by crystallizing amorphous silicon. In case that the semiconductor layer includes an oxide semiconductor, each of the active layers ACT1, ACT2 and ACT3 may include conductive regions ACTa and ACTb and a channel region ACTc therebetween. The oxide semiconductor may be an oxide semiconductor containing indium (In). In some embodiments, the oxide semiconductor may be indium-tin oxide (ITO), indium-zinc oxide (IZO), indium-gallium oxide (IGO), indium-zinc-tin oxide (IZTO), indium-gallium-zinc oxide (IGZO), indium-gallium-tin oxide (IGTO), indium-gallium-zinc-tin oxide (IGZTO), etc.

In other embodiments, the semiconductor layer may include polycrystalline silicon. The polycrystalline silicon may be formed by crystallizing amorphous silicon, and the conductive regions of the active layers ACT1, ACT2 and ACT3 may be doped regions doped with impurities. It is, however, to be understood that the disclosure is not limited thereto.

A first gate insulating layer 13 is disposed on the semiconductor layer and the buffer layer 12. The first gate insulating layer 13 may include a semiconductor layer, and may be disposed on the buffer layer 12. The first gate insulating layer 13 may work as a gate insulator of each of the thin-film transistors. The first gate insulating layer 13 may be formed of an inorganic layer including an inorganic material, such as silicon oxide (SiOx), silicon nitride (SiNx) and silicon oxynitride (SiON), or may be formed of a stack of the materials.

The first gate conductive layer may be disposed on the first gate insulating layer 13. The first gate conductive layer may include gate electrodes G1, G2 and G3 of the transistors T1, T2 and T3, the scan line SCL, the sensing line SSL, the initialization voltage distribution line IDL, and a first capacitor electrode CSE1 of the storage capacitor. The scan line SCL, the sensing line SSL and the initialization voltage division line IDL have been described above, and thus the gate electrodes and the first capacitor electrode CSE1 will be described below.

The gate electrodes G1, G2 and G3 of the first gate conductive layer may partially overlap the active layers of the transistors T1, T2 and T3, respectively. For example, the first gate electrode G1 of the first transistor T1 may partially overlap the first active layer ACT1. The first gate electrode G1 may be connected with the first capacitor electrode CSE1 of the storage capacitor to be described later as a single piece.

The second gate electrode G2 may be electrically connected to the scan line SCL, and a scan signal may be applied to the second transistor T2. The third gate electrode G3 may be electrically connected to the scan line SCL, and a sensing signal may be applied to the gate electrode of the third transistor T3.

The first capacitance electrode CSE1 or Cst1 of the storage capacitor Cst may be disposed between the scan line SCL and the sensing line SSL. The first capacitor electrode CSE1 may be electrically connected to the first gate electrode G1 of the first transistor T1 and the source electrode of the second transistor T2. For example, the first capacitor electrode CSE1 may be formed integrally with the first gate electrode G1, and may be connected to the source electrode of the second transistor T2 through a contact hole CT7.

The first gate conductive layer may be made up of a single layer or multiple layers of at least one of molybdenum (Mo), aluminum (Al), chromium (Cr), gold (Au), titanium (T1), nickel (Ni), neodymium (Nd) and copper (Cu) or an alloy thereof. It is, however, to be understood that the disclosure is not limited thereto.

The first protective layer 15 is disposed on the first gate conductive layer. The first protective layer 15 may be disposed to cover the first gate conductive layer to serve to protect it. The first protective layer 15 may be formed of an inorganic layer including an inorganic material, such as silicon oxide (SiOx), silicon nitride (SiNx) and silicon oxynitride (SiON), or may be formed of a stack of the materials.

The first data conductive layer is disposed on the first protective layer 15. The first data conductive layer may include the source and drain electrodes of the transistors T1, T2 and T3, the data line DTL, the initialization voltage line VIL, the second capacitor electrode CSE2 or Cst2 of the storage capacitor, as well as conductive patterns DP1 and DP2. The data line DTL and the initialization voltage line VIL have been described above, and thus Hereinafter, the source electrodes, the drain electrodes, the second capacitor electrode CSE2, and the conductive patterns will be described.

The first source electrode S1 and the first drain electrode D1 of the first transistor T1 may be disposed to partially overlap the first active layer ACT1. The first source electrode S1 and the first drain electrode D1 may be in contact with the first active layer ACT1 through contact holes CT1 penetrating the first protective layer 15 and the first gate insulating layer 13. The first source electrode S1 may be in contact with the light-blocking layer BML, through a contact hole CT5 penetrating the first protective layer 15, the first gate insulating layer 13, and the buffer layer 12. The first drain electrode D1 may be electrically connected to the first voltage line VDL, and the first source electrode S1 may be connected to the second capacitor electrode CSE2 of the storage capacitor connected to the first electrode 21 of the light-emitting diode EL. For example, the first drain electrode D1 may be in direct contact with the first voltage line VDL through a contact hole, and the first source electrode S1 may be integrally connected to the second capacitor electrode CSE2.

The second source electrode S2 and the second drain electrode D2 of the second transistor T2 may be disposed to partially overlap the second active layer ACT2. The second source electrode S2 and the second drain electrode D2 may be in contact with the second active layer ACT2 through contact holes CT3 penetrating the first protective layer 15 and the first gate insulating layer 13. The second drain electrode D2 may be integrally connected to the data line DTL, and the second source electrode S2 may be in contact with the first capacitor electrode CSE1 through a contact hole CT7 penetrating the first protective layer 15. The second transistor T2 may be turned on in response to the scan signal to transmit the data signal applied from the data line DTL to the first gate electrode G1 of the first transistor T1.

The third source electrode S3 and the third drain electrode D3 of the third transistor T3 may be disposed to partially overlap the third active layer ACT3. The third source electrode S3 and the third drain electrode D3 may be in contact with the third active layer ACT3 through contact holes CT4 penetrating the first protective layer 15 and the first gate insulating layer 13. The third drain electrode D3 may be in contact with the initialization voltage distribution line IDL through a contact hole CT9 penetrating through the first protective layer 15, and the third source electrode S3 may be connected to the second capacitor electrode CSE2 of the storage capacitor. For example, the third source electrode S3 may be integrally connected to the second capacitor electrode CSE2. The initialization voltage distribution line IDL may be connected to the initialization voltage line VIL through a contact hole CT10 penetrating through the first protective layer 15 to apply the initialization voltage, and the initialization voltage may be transmitted to the third drain electrode D3. The third transistor T3 may be turned on in response to the sensing signal to transmit the initialization voltage to the first electrode of the light-emitting diode EL through the second capacitor electrode CSE2.

The second capacitor electrode CSE2 of the storage capacitor Cst may be disposed to overlap the first capacitor electrode CSE1. The second capacitor electrode CSE2 may be connected with the first source electrode S1 of the first transistor T1 and the third source electrode S3 of the third transistor T3 as a single piece.

A first conductive pattern DP1 may be disposed to overlap the scan line SCL and the second gate electrode G2. The first conductive pattern DP1 may be in contact with the scan line SCL and the second gate electrode G2 through a contact hole CT6 penetrating the first protective layer 15. The second gate electrode G2 may be electrically connected to the scan line SCL through the first conductive pattern DP1. A second conductive pattern DP2 may be disposed to overlap a sensing line SSL and a third gate electrode G3. The second conductive pattern DP2 may be in contact with the sensing line SSL and the third gate electrode G3 through a contact hole CT8 penetrating the first protective layer 15. The third gate electrode G3 may be electrically connected to the sensing line SSL through the second conductive pattern DP2.

The first data conductive layer may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof. It is, however, to be understood that the disclosure is not limited thereto.

The first interlayer dielectric layer 17 is disposed on the first data conductive layer. The first interlayer dielectric layer 17 may serve as an insulating layer between the first data conductive layer and other layers disposed thereon. In addition, the first interlayer dielectric layer 17 may cover the first data conductive layer to protect it. The first interlayer dielectric layer 17 may be formed of an inorganic layer including an inorganic material, such as silicon oxide (SiOx), silicon nitride (SiNx) and silicon oxynitride (SiON), or may be formed of a stack of the materials.

The second data conductive layer is disposed on the first interlayer dielectric layer 17. The second data conductive layer may include the first voltage line VDL and the second voltage line VSL. It is, however, to be understood that the disclosure is not limited thereto. The second data conductive layer may further include multiple conductive patterns. The first voltage line VDL may be electrically connected to the first drain electrode D1 of the first transistor T1 through a contact hole penetrating the first interlayer dielectric layer 17. The first supply voltage applied to the first voltage line VDL may be transferred to the first electrode 21 of the light-emitting diode EL through the first transistor T1. The second voltage line VSL may be electrically connected to the second electrode 21 of the light-emitting diode EL, and may transfer the second supply voltage to the second electrode 21. The first voltage line VDL and the second voltage line VSL have been described above; and, therefore, the redundant descriptions will be omitted.

The second data conductive layer may be made up of a single layer or multiple layers of at least one of molybdenum (Mo), aluminum (Al), chromium (Cr), gold (Au), titanium (Ti), nickel (Ni), neodymium (Nd) and copper (Cu) or an alloy thereof. It is, however, to be understood that the disclosure is not limited thereto.

The first planarization layer 19 may be disposed on the second data conductive layer. The first planarization layer 19 may include an organic insulating material, e.g., an organic material such as polyimide (PI), to provide a flat surface.

On the first planarization layer 19, multiple first banks 40, multiple electrodes 21, a multiple light-emitting elements ED, a second bank 45, and multiple contact electrodes 26 and 27 are disposed. Multiple insulating layers 51, 52, 53 and 54 may be further disposed on the first planarization layer 19.

The first banks 40 may be disposed directly on the first planarization layer 19. The first banks 40 may be extended in the second direction DR2 within each of the sub-pixels PXn, and may be disposed inside the emission area EMA so that they are not extended to an adjacent sub-pixel PXn in the second direction DR2. The first banks 40 may be spaced apart from one another in the first direction DR1, and may form areas therebetween where the light-emitting elements ED may be disposed. The first banks 40 may be disposed in each of the sub-pixels PXn to form a linear pattern in the display area DPA of the display device 10. Although two first banks 40 are shown in the drawings, the disclosure is not limited thereto. More than two first banks 40 may be further disposed depending on the number of the electrodes 21 to be described below.

The first banks 40 may have a structure that at least partly protrudes from the upper surface of the first planarization layer 19. The protruding part of each of the banks 40 may have inclined side surfaces, and light emitted from the light-emitting element ED may proceed toward the inclined side surfaces of each of the banks 40. The electrodes 21 disposed on the first banks 40 may include a material having a high reflectivity, and the light emitted from the light-emitting element ED may be reflected off the electrodes 21 disposed on the side surfaces of the first banks 40, so that the light may exit toward the upper side of the first planarization layer 19. That is to say, the first banks 40 may provide the area where the light-emitting elements ED are disposed and may also serve as reflective partition walls that reflect light emitted from the light-emitting elements ED toward the upper side. The side surfaces of the first banks 40 may be inclined in a linear shape, but the disclosure is not limited thereto. The first banks 40 may have a semicircle or semi-ellipse shape with curved outer surface. According to an embodiment of the disclosure, the first banks 40 may include, but are not limited to, an organic insulating material such as polyimide (PI).

The electrodes 21 may be disposed on the first banks 40 and the first planarization layer 19. The electrodes 21 may include a first electrode 21 and a second electrode 21. The first electrode 21 and the second electrode 21 may be extended in the second direction DR2 and may be spaced apart from each other in the first direction DR1.

The first electrode 21 and the second electrode 21 may be extended in the second direction DR2 in each of the sub-pixels PXn, and they may be spaced apart from other electrodes 21 in the cut area CBA. In some embodiments, the cut area CBA may be located between the emission areas EMA of the neighboring sub-pixels PXn in the second direction DR2, and the first electrode 21 and the second electrode 21 may be separated from other first electrode 21 and second electrode 21 disposed in the adjacent sub-pixel PXn in the second direction DR2 at the cut area CBA. It is, however, to be understood that the disclosure is not limited thereto. Some electrodes 21 may not be disposed separately in each of the sub-pixels PXn but may be extended and disposed across adjacent sub-pixels PXn in the second direction DR2. In other embodiments, only one of the first electrode 21 and the second electrode 21 may be separated.

The first electrode 21 may be connected to the second voltage line VSL through an electrode contact hole CTS penetrating through the first planarization layer 19 and the first interlayer dielectric layer 17. The second electrode 21 may be connected to the second voltage line VSL through the electrode contact hole CTS penetrating through the first planarization layer 19 and the first interlayer dielectric layer 17.

For example, the first electrode 21 and the second electrode 21 may overlap a part of the second bank 45 that is extended in the first direction DR1, and an electrode contact hole CTS may be formed where the electrodes 21 and the second bank 45 overlap each other.

Each of the first electrode 21 and the second electrode 21 may be in contact with an electrode conductive pattern disposed on the second data conductive layer, and the position of the electrode contact hole CTS may vary depending on the arrangement of the electrode conductive pattern. For example, every electrode contact hole CTS may be formed in the emission area EMA.

Although one first electrode 21 and one second electrode 21 is disposed in each sub-pixel PXn in the drawings, the disclosure is not limited thereto. In some embodiments, a greater number of first electrodes 21 and second electrodes 21 may be disposed in each sub-pixel PXn. The first electrode 21 and the second electrode 21 disposed in each of the sub-pixels PXn may not necessarily have a shape extended in one direction but may have a variety of structures. For example, the first electrode 21 and the second electrode 21 may have a partially curved or bent shape, and an electrode may be disposed to surround another electrode.

The first electrode 21 and the second electrode 21 may be disposed on the first banks 40, respectively. According to some embodiments of the disclosure, each of the first electrode 21 and the second electrode 21 may have a larger width than that of the first banks 40. For example, the first electrode 21 and the second electrode 21 may be disposed to cover the outer surfaces of the first banks 40. The first electrode 21 and the second electrode 21 may be disposed on the side surfaces of the first banks 40, respectively, and the distance between the first electrode 21 and the second electrode 21 may be smaller than the distance between the first banks 40. At least a part of the first electrode 21 and the second electrode 21 may be disposed directly on the first planarization layer 19.

Each of the electrodes 21 may include a conductive material having a high reflectance. For example, each of the electrodes 21 may include a metal such as silver (Ag), copper (Cu) and/or aluminum (Al) as the material having a high reflectance, and may be an alloy including aluminum (Al), nickel (Ni), lanthanum (La), etc. Each of the electrodes 21 may reflect light that is emitted from the light-emitting element ED and travels toward the side surfaces of the first banks 40 toward the upper side of each of the sub-pixels PXn.

It is, however, to be understood that the disclosure is not limited thereto. The electrodes 21 may further include a transparent conductive material. For example, each of the electrodes 21 may include a material such as indium tin oxide (ITO), indium zinc oxide (IZO) and indium tin zinc oxide (ITZO). In some embodiments, each of the electrodes 21 may have a structure in which one or more layers of a transparent conductive material and a metal layer having high reflectivity are stacked on one another, or may be made up of a single layer including them. For example, each of the electrodes 21 may have a stack structure such as ITO/silver (Ag)/ITO/, ITO/Ag/IZO, or ITO/Ag/ITZO/IZO.

The electrodes 21 may be electrically insulated from contact electrodes 26 and 27 to be described later. Specifically, the electrodes 21 may be electrodes for aligning the light-emitting elements ED in a fabrication mode of the display device, and the contact electrodes 26 and 27 to be described later may be electrically connected to the light-emitting elements ED to allow the light-emitting elements ED to emit light.

As described above, the electrodes 21 may be utilized to form an electric field within the sub-pixels PXn to align the light-emitting elements ED. The light-emitting elements ED may be disposed between the first electrode 21 and the second electrode 21 by an electric field formed between the first electrode 21 and the second capacitor electrode CSE2 and the second electrode 21 and the second capacitor electrode CSE2 thereunder. According to an embodiment of the disclosure, the light-emitting elements ED of the display device 10 may be ejected onto the electrodes 21 via an inkjet printing process. In case that droplets of the ink containing the light-emitting elements ED are ejected onto the electrodes 21, alignment signals may be applied to the second capacitor electrode CSE2 and the electrodes 21, respectively, to generate electric field. For example, a first alignment signal (or a first alignment voltage) may be applied to the second capacitor electrode CES2, and a second alignment signal (or a second alignment voltage) may be applied to the electrodes 21. A certain electric field may be generated between the second capacitor electrode CES2 and the electrodes 21 through the first alignment signal and the second alignment signal.

The light-emitting elements ED dispersed in the ink may be aligned on the electrodes 21 by receiving a dielectrophoretic force by the electric field generated between the electrodes 21 and the second capacitor electrode CSE2.

In order to form an electric field between the electrodes 21 and the second capacitor electrode CSE2 through alignment signals, the second capacitor electrode CSE2 may overlap the first electrode 21 and the second electrode 21 in the thickness direction. The second capacitor electrode CSE2 may overlap a part of the first electrode 21 and a part of the second electrode 21 in the thickness direction. For example, the second capacitor electrode CES2 may overlap a part of the first electrode 21 that does not overlap the first bank 40 and a part of the second electrode 21 that does not overlap the first bank 40 in the thickness direction. The light-emitting elements ED aligned on the electrodes 21 may completely overlap the second capacitor electrode CSE2 in the thickness direction.

In case that the light-emitting elements ED are aligned on the first electrode and the second electrode, in an embodiment where the light-emitting elements ED are disposed between the first electrode and the second electrode by the electric field formed on the first electrode and the second electrode, if the first alignment signal is applied to the first electrode and the second alignment signal is applied to the second electrode, for example, there may be formed a parasitic electric field between the first and/or second electrodes and other conductive layers located under the first electrode and the second electrode.

In contrast, according to the embodiment, in the fabrication mode of the display device, the first alignment signal (or the first alignment voltage) may be applied to the second capacitor electrode CES2, the second alignment signal (or the second alignment voltage) may be applied to the electrodes 21, and certain electric field is formed between the second capacitor electrode CES2 and the electrodes 21 through the second alignment signal and the second alignment signal to align the light-emitting elements ED. In this manner, it may be possible to prevent a parasitic electric field from being formed between the first and/or second electrodes and other conductive layers located under the first electrode and the second electrode.

The first insulating layer 51 may be disposed on the first planarization layer 19, the first electrode 21 and the second electrode 21. The first insulating layer 51 is disposed to partially cover the first electrode 21 and the second electrode 21 including the area therebetween. For example, the first insulating layer 51 may cover the majority of the upper surface of each of the first electrode 21 and the second electrode 21 and may expose a part of each of the first electrode 21 and the second electrode 21. In other words, the first insulating layer 51 may be formed substantially entirely on the first planarization layer 19, and may include openings (not shown) partially exposing the first electrode 21 and the second electrode 21.

In an embodiment, the first insulating layer 51 may have a step so that a part of the upper surface is recessed between the first electrode 21 and the second electrode 21. It is, however, to be understood that the disclosure is not limited thereto. The first insulating layer 51 may form a flat upper surface so that the light-emitting elements ED may be disposed.

The first insulating layer 51 can protect the first electrode 21 and the second electrode 21 and insulate them from each other. In addition, the first insulating layer 51 can prevent that the light-emitting elements ED disposed on it are brought into contact with other elements and damaged. It is to be understood that the shape and structure of the first insulating layer 51 are not limited thereto.

The second bank 45 may be disposed on the first insulating layer 51. The second bank 45 may be disposed in a lattice pattern on the entire surface of the display area DPA including portions extended in the first direction DR1 and the second direction DR2 in plan view. The second bank 45 may be disposed along the border of each of the sub-pixels PXn to distinguish adjacent sub-pixels PXn from one another. According to an embodiment of the disclosure, the second bank 45 may have a height greater than a height of the first banks 40. The second bank 45 can prevent an ink from overflowing into adjacent sub-pixels PX during an inkjet printing process of the process of fabricating the display device 10. The second bank 45 can separate different sub-pixels PXn from one another so that the ink in which different light-emitting elements ED are dispersed are not mixed.

The second bank 45 may be disposed to surround the emission area EMA and the cut area CBA disposed in each of the sub-pixels PXn to distinguish them. The first electrode 21 and the second electrode 21 may be extended in the second direction DR2 and may be disposed across a part of the second bank 45 that is extended in the first direction DR1. The part of the second bank 45 extended in the second direction DR2 may have a larger width between the emission areas EMA than between the cut areas CBA. Accordingly, the distance between the cut areas CBA may be smaller than the distance between the emission areas EMA. The second bank 45 may include, but is not limited to, polyimide (PI), like the first bank 40.

The light-emitting elements ED may be disposed on the first insulating layer 51. The light-emitting elements ED may be spaced apart from one another in the second direction DR2 in which the electrodes 21 are extended, and may be aligned substantially parallel to one another. The spacing between the light-emitting elements ED is not particularly limited herein. The light-emitting elements ED may have a shape extended in a direction. The direction in which the electrodes 21 are extended may be substantially perpendicular to the direction in which the light-emitting diodes ED are extended. It is, however, to be understood that the disclosure is not limited thereto. The light-emitting elements ED may be oriented obliquely to the direction in which the electrodes 21 are extended, rather than being perpendicular to it.

The light-emitting elements ED may include emissive layers 76 including different materials to emit light of different wavelength bands to the outside. The display device 10 may include the light-emitting elements ED that emit light of different wavelengths. Accordingly, lights of the first color, the second color and the third color may exit from the first sub-pixel PX1, the second sub-pixel PX2 and the third sub-pixel PX3, respectively. It is, however, to be understood that the disclosure is not limited thereto. In some implementations, the sub-pixels PXn may include the same kind of light-emitting elements ED and may emit light of substantially the same color.

Both ends of the light-emitting elements ED may be disposed on the electrodes 21 between the first banks 40, respectively. For example, an end of each of the light-emitting elements ED may be located on the first electrode 21, while the opposite end thereof may be located on the second electrode 21. The length of the light-emitting elements ED may be larger than the distance between the first electrode 21 and the second electrode 21, and the ends of the light-emitting elements ED may be disposed on the first electrode 21 and the second electrode 21, respectively.

Multiple layers of the light-emitting elements ED may be disposed in the direction perpendicular to the upper surface of the first substrate 11 or the first planarization layer 19. The light-emitting elements ED of the display device 10 may be arranged such that they are extended in parallel to the first planarization layer 19. The semiconductor layers included in the light-emitting elements ED may be disposed sequentially in the direction parallel to the upper surface of the first planarization layer 19. It is, however, to be understood that the disclosure is not limited thereto. In some implementations, in case that the light-emitting elements ED have a different structure, the multiple layers may be disposed in the direction perpendicular to the first planarization layer 19.

The ends of each of the light-emitting elements ED may be in contact with the contact electrodes 26 and 27, respectively. According to an embodiment of the disclosure, a part of the semiconductor layer of each of the light-emitting elements ED may be exposed because an insulating film 38 is not formed at the end surface on the side of the extending direction, the exposed part of the semiconductor layer may be in contact with the contact electrodes 26 and 27. It is, however, to be understood that the disclosure is not limited thereto. In some implementations, at least a part of the insulating film 38 may be removed and the insulating film 38 may be removed, so that the end surfaces of the semiconductor layers of the light-emitting elements ED may be partially exposed. The exposed side surface of the semiconductor layer may be in direct contact with the contact electrodes 26 and 27.

The second insulating layer 52 may be partially disposed on the light-emitting elements ED. For example, the second insulating layer 52 may be disposed to partially surround the outer surfaces of the light-emitting elements ED so that the ends and the opposite ends of the light-emitting elements ED are not covered. The contact electrodes 26 and 27 may be in contact with the ends of the light-emitting elements ED not covered by the second insulating layer 52, which will be described later. The part of the second insulating layer 52 which is disposed on the light-emitting elements ED may be extended in the second direction DR2 on the first insulating layer PAS1 in plan view, thereby forming a linear or island-like pattern in each of the sub-pixels PXn. The second insulating layer 52 can protect the light-emitting elements ED and fix the light-emitting elements ED during the process of fabricating the display device 10.

The contact electrodes 26 and 27 and a third insulating layer 53 may be disposed on the second insulating layer 52.

The contact electrodes 26 and 27 may have a shape extended in a direction. The first and second contact electrodes 26 and 27 may be disposed on parts of the first electrode 21 and the second electrode 21, respectively. The first contact electrode 26 may be disposed on the first electrode 21, the second contact electrode 27 may be disposed on the second electrode 21, and each of the first contact electrode 26 and the second contact electrode 27 may have a shape extended in the second direction DR2. The first contact electrode 26 and the second contact electrode 27 may be spaced apart from each other in the first direction DR1, and they may form a stripe pattern inside the emission area EMA of each sub-pixel PXn.

In some embodiments, the widths of the first contact electrode 26 and the second contact electrode 27 measured in a direction may be equal to or smaller than the widths of the first electrode 21 and the second electrode 21 measured in the direction, respectively.

The first contact electrode 26 and the second contact electrode 27 may be in contact with an end and the opposite end of each of the light-emitting elements ED, respectively.

One of the first contact electrode 26 and the second contact electrode 27 may be electrically connected to an anode electrode of each of the light-emitting elements ED, while the opposite one thereof may be electrically connected to a cathode electrode of each of the light-emitting elements ED. It is, however, to be understood that the disclosure is not limited thereto.

Although one first contact electrode 26 and one second contact electrode 27 are disposed in one sub-pixel PXn in the drawings, the disclosure is not limited thereto. The numbers of the first contact electrode 26 and the second contact electrode 27 may vary depending on the numbers of the first electrode 21 and the second electrodes 21 disposed in each of the sub-pixels PXn.

The third insulating layer 53 is disposed on the first contact electrode 26. The third insulating layer 53 may electrically insulate the first contact electrode 26 from the second contact electrode 27. The third insulating layer 53 is disposed to cover the first contact electrode 26 and may not be disposed on the opposite ends of the light-emitting elements ED so that the light-emitting elements ED come in contact with the second contact electrode 27. The third insulating layer 53 may be in contact with a part of each of the first contact electrode 26 and the second insulating layer 52 on the upper surface of the second insulating layer 52. The side surface of the third insulating layer 53 on the side where the second electrode 21 is disposed may be aligned with the side surface of the second insulating layer 52. The third insulating layer 53 may also be disposed in the non-emission area, for example, on the first insulating layer 51 disposed on the first planarization layer 19. It is, however, to be understood that the disclosure is not limited thereto.

The second contact electrode 27 may be disposed on the second electrode 21, the second insulating layer 52 and the third insulating layer 53. The second contact electrode 27 may be in contact with the second end of the light-emitting element ED.

The second contact electrode 27 may be partially in contact with the second insulating layer 52, the third insulating layer 53 and the light-emitting elements ED. The first contact electrode 26 and the second contact electrode 27 may not be in contact with each other by the second insulating layer 52 and the third insulating layer 53. It is, however, to be understood that the disclosure is not limited thereto. In some implementations, the third insulating layer 53 may be eliminated.

The contact electrodes 26 and 27 may include a conductive material. For example, the connection electrodes CNE may include ITO, IZO, ITZO, aluminum (Al), etc. For example, the contact electrodes 26 and 27 may include a transparent conductive material, and light emitted from the light-emitting elements ED may transmit the contact electrodes 26 and 27 to proceed toward the electrodes 21. It is, however, to be understood that the disclosure is not limited thereto.

The fourth insulating layer 54 may be disposed entirely on the first substrate 11. The fourth insulating layer 54 may serve to protect the elements disposed on the first substrate 11 against the external environment.

Each of the first insulating layer 51, the second insulating layer 52, the third insulating layer 53 and the fourth insulating layer 54 may include an inorganic insulating material or an organic insulating material. According to an embodiment of the disclosure, the first insulating layer 51, the second insulating layer 52, the third insulating layer 53 and the fourth insulating layer 54 may include an inorganic insulating material such as silicon oxide (SiOx), silicon nitride (SiNx), silicon oxynitride (SiOxNy), aluminum oxide ($Al_2O_3$) and/or aluminum nitride (AlN). Alternatively, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the disclosure is not limited thereto.

Incidentally, the first electrode 21 and the second electrode 21 may transmit a driving signal to the light-emitting elements ED while the display device 10 is being driven so that the light-emitting elements ED may emit light. During or in a driving mode of the display device 10, the first supply voltage is transmitted to the first electrode 21 through the first transistor T1, and the second supply voltage is transmitted to the second electrode 21 through the second voltage line VSL. A data signal may be applied to the first gate electrode G1 of the first transistor T1 through the second transistor T2, and the initialization voltage may be transmitted to the first source electrode S1 and the first electrode 21 through the transistor T3.

Figure 9:
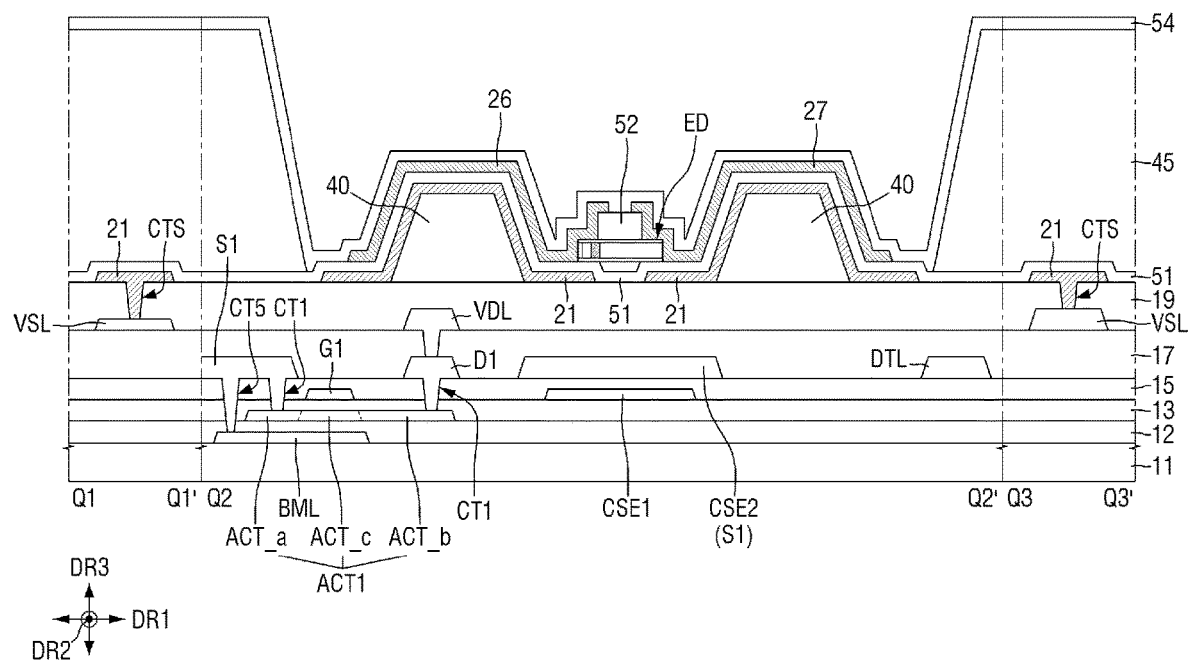
FIG. 9 is a cross-sectional view schematically showing a part of a display device according to another embodiment of the disclosure.

FIG. 9 is a cross-sectional view schematically showing a part of a display device according to another embodiment of the disclosure.

Referring to FIG. 9, the third insulating layer 53 may be eliminated from the display device 10. A part of the second contact electrode 27 may be disposed directly on the second insulating layer 52, and the first contact electrode 26 and the second contact electrode 27 may be spaced apart from each other on the second insulating layer 52. According to an embodiment of the disclosure, even though the third insulating layer 53 is eliminated from the display device 10, the second insulating layer 52 includes an organic insulating material to fix the light-emitting elements ED. The first contact electrode 26 and the second contact electrode 27 may be formed together via a patterning process. The embodiment of FIG. 9 may be similar or identical to the embodiment of FIG. 3 except that the third insulating layer 53 may be further eliminated. In the following description, the redundant description will be omitted.

Figure 10:
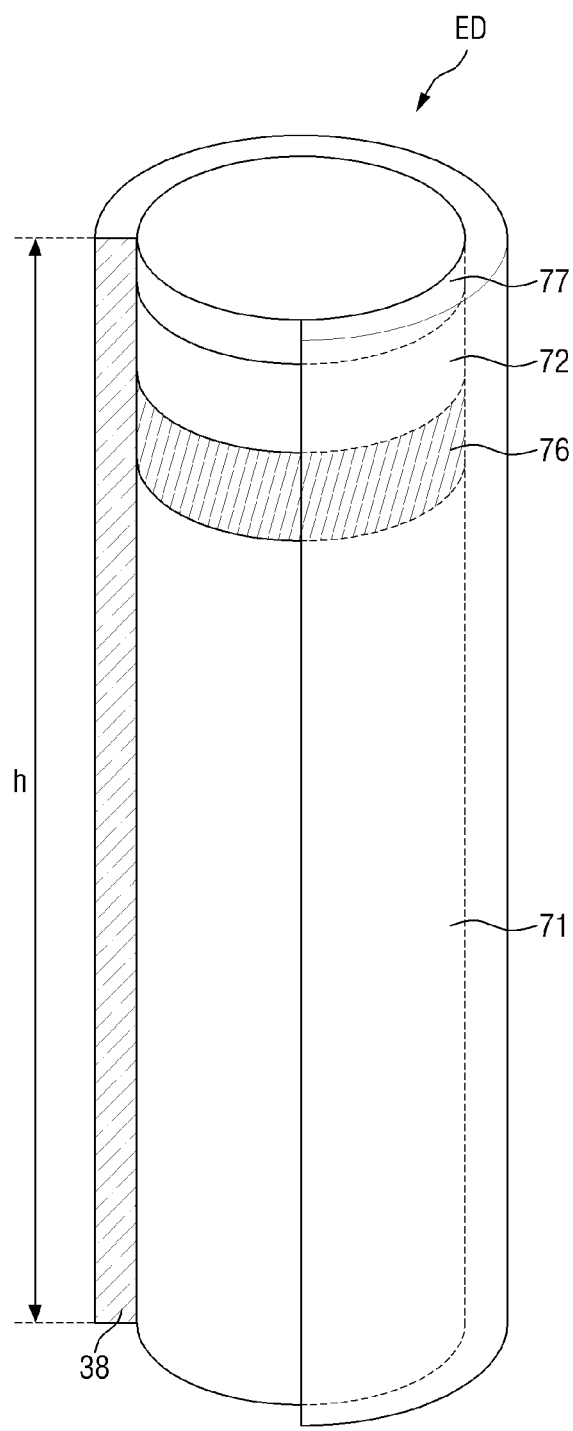
FIG. 10 is a view schematically showing a light-emitting element according to an embodiment of the disclosure.

FIG. 10 is a view schematically showing a light-emitting element according to an embodiment of the disclosure.

The light-emitting element ED may be a light-emitting diode. Specifically, the light-emitting element ED may be an inorganic light-emitting diode that has a size in micrometers or nanometers and is made of an inorganic material. Inorganic light-emitting diodes may be aligned between two electrodes facing each other as polarities are created by forming an electric field in a particular direction between the two electrodes. The light-emitting diode ED may be aligned between two electrodes by an electric field formed over the two electrodes.

The light-emitting diode ED according to an embodiment may have a shape extended in a direction. The light-emitting diode ED may have a shape of a rod, wire, tube, etc. In an embodiment, the light-emitting diode ED may have a cylindrical or rod-like shape. It is to be understood that the shape of the light-emitting diode ED is not limited thereto. The light-emitting diode ED may have a variety of shapes including a polygonal column shape such as a cube, a cuboid and a hexagonal column, or a shape that is extended in a direction with partially inclined outer surfaces. The semiconductors included in the light-emitting diode ED to be described later may have a structure sequentially arranged or stacked along the direction.

The light-emitting diode ED may include semiconductor layers doped with impurities of a conductive type (e.g., p-type or n-type). The semiconductor layers may emit light of a certain wavelength band by transmitting an electric signal applied from an external power source.

As shown in FIG. 10, the light-emitting diode ED may include a first semiconductor layer 71, a second semiconductor layer 72, an emissive layer 76, an electrode layer 77 and an insulating film 38.

The first semiconductor layer 71 may be an n-type semiconductor. For example, in case that the light-emitting diode ED emits light of a blue wavelength band, the first semiconductor layer 71 may include a semiconductor material having the following chemical formula: $Al_xGa_yIn_{1-x-y}N$ ($0 \le x \le 1, 0 \le y \le 1, 0 \le x+y \le 1$). For example, it may be at least one of n-type doped AlGaInN, GaN, AlGaN, InGaN, AlN and InN. The first semiconductor layer 71 may be doped with an n-type dopant, and the n-type dopant may be Si, Ge, Sn, etc., for example. According to an embodiment of the disclosure, the first semiconductor layer 71 may be n-GaN doped with n-type Si. The length of the first semiconductor layer 71 may range, but is not limited to, from 1.5 µm to 5 µm.

The second semiconductor layer 72 may be disposed on the emissive layer 76 to be described later. The second semiconductor layer 72 may be a p-type semiconductor. For example, in case that the light-emitting diode emits light of a blue or green wavelength band, the second semiconductor layer 72 may include a semiconductor material having the following chemical formula: $Al_xGa_yIn_{1-x-y}N$ ($0 \le x \le 1, 0 \le y \le 1, 0 \le x+y \le 1$). For example, it may be at least one of p-type doped AlGaInN, GaN, AlGaN, InGaN, AlN and InN. The second semiconductor layer 72 may be doped with a p-type dopant, and the p-type dopant may be Mg, Zn, Ca, Se, Ba, etc., for example. According to an embodiment of the disclosure, the second semiconductor layer 72 may be p-GaN doped with p-type Mg. The length of the second semiconductor layer 72 may range, but is not limited to, from 0.05 µm to 0.10 µm.

Although each of the first semiconductor layer 71 and the second semiconductor layer 72 is implemented as a signal layer in the drawings, the disclosure is not limited thereto. According to some embodiments of the disclosure, depending on the material of the emissive layer 76, the first semiconductor layer 71 and the second semiconductor layer 72 may further include a larger number of layers, e.g., a clad layer or a tensile strain barrier reducing (TSBR) layer.

The emissive layer 76 may be disposed between the first semiconductor layer 71 and the second semiconductor layer 72. The emissive layer 76 may include a material having a single or multiple quantum well structure. In case that the emissive layer 76 includes a material having the multiple quantum well structure, the structure may include quantum layers and well layers alternately stacked on one another. The emissive layer 76 may emit light as electron-hole pairs are combined therein in response to an electrical signal applied through the first semiconductor layer 71 and the second semiconductor layer 72. For example, in case that the emissive layer 76 emits light of the blue wavelength band, it may include a material such as AlGaN and AlGaInN. In particular, in case that the emissive layer 76 has a multi-quantum well structure in which quantum layers and well layers are alternately stacked on one another, the quantum layers may include AlGaN or AlGaInN, and the well layers may include a material such as GaN and AlGaN. According to an embodiment of the disclosure, the emissive layer 76 may include AlGaInN as the quantum layer and AlInN as the well layer, and, the emissive layer 76 may emit blue light having a center wavelength band of 450 nm to 495 nm.

It is, however, to be understood that the disclosure is not limited thereto. The emissive layer 76 may have a structure in which a semiconductor material having a large band gap energy and a semiconductor material having a small band gap energy are alternately stacked on one another, and may include other Group III to Group V semiconductor materials depending on the wavelength range of the emitted light. Accordingly, the light emitted from the emissive layer 76 is not limited to the light of the blue wavelength band. The emissive layer 76 may emit light of red or green wavelength band in some implementations. The length of the emissive layer 76 may be, but is not limited to, in the range of 0.05 µm to 0.10 µm.

The light emitted from the emissive layer 76 may exit not only through the outer surfaces of the light-emitting element ED in the longitudinal direction but also through the side surfaces. The direction in which the light emitted from the emissive layer 76 propagates is not limited to one direction.

The electrode layer 77 may be an ohmic contact electrode. It is, however, to be understood that the disclosure is not limited thereto. The element electrode layer may be Schottky contact electrodes. The light-emitting diode ED may include at least one electrode layer 77. Although the light-emitting element ED includes one electrode layer 77 in the example shown in FIG. 10, the disclosure is not limited thereto. In some implementations, the light-emitting element ED may include a larger number of electrode layers 77 or the electrode layer may be omitted. The following description on the light-emitting element ED may be equally applied even if the number of electrode layers 77 is different or it further includes other structures.

The electrode layer 77 can reduce the resistance between the light-emitting element ED and the electrodes or the contact electrodes in case that the light-emitting element ED is electrically connected to the electrodes or the contact electrodes in the display device 10 according to the embodiment of the disclosure. The electrode layer 77 may include a metal having conductivity. For example, the electrode layer 77 may include at least one of aluminum (Al), titanium (Ti), indium (In), gold (Au), silver (Ag), indium tin oxide (ITO), indium zinc oxide (IZO) and indium tin-zinc oxide (ITZO). The electrode layer 77 may include a semiconductor material doped with n-type or p-type impurities. The electrode layer 77 may include the same material or may include different materials. It is, however, to be understood that the disclosure is not limited thereto.

The insulating film 38 may be disposed to surround the outer surfaces of the semiconductor layers and electrode layers. According to an embodiment of the disclosure, the insulating film 38 may be disposed to surround at least the outer surface of the emissive layer 76, and may be extended in a direction in which the light-emitting diode ED is extended. The insulating film 38 can protect the above-described elements. For example, the insulating film 38 may be formed to surround the side surfaces of the elements, and both ends of the light-emitting diode ED in the longitudinal direction may be exposed.

Although the insulating film 38 is extended in the longitudinal direction of the light-emitting diode ED to cover from the first semiconductor layer 71 to the side surface of the electrode layer 77 in the example shown in the drawing, the disclosure is not limited thereto. The insulating film 38 may cover only the outer surface of a part of the semiconductor layer, including the emissive layer 76, or may cover only a part of the outer surface of the electrode layer 77 to partially expose the outer surface of the electrode layer 77. A part of the upper surface of the insulating film 38 may be rounded in cross section, which is adjacent to at least one of the ends of the light-emitting element ED.

The thickness of the insulating film 38 may be, but is not limited to, in the range of 10 nm to 1.0 µm. In an embodiment, the thickness of the insulating film 38 may be approximately 40 nm.

The insulating film 38 may include materials having an insulating property such as silicon oxide ($SiOx$), silicon nitride ($SiNx$), silicon oxynitride ($SiOxNy$), aluminum nitride (AlN) and/or aluminum oxide ($Al_2O_3$). Accordingly, it may be possible to prevent an electrical short-circuit that may occur in case that the emissive layer 76 comes in contact with an electrode through which an electric signal is transmitted to the light-emitting diode ED. Since the insulating film 38 includes the emissive layer 76 to protect the outer surface of the light-emitting diode ED, it may be possible to prevent a decrease in luminous efficiency.

In some embodiments, the outer surface of the insulating film 38 may be subjected to surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting elements ED dispersed in the ink from being aggregated with one another.

The length h of the light-emitting elements ED may range from 1 µm to 10 µm or from 2 µm to 6 µm, and in an embodiment approximately 3 µm to 5 µm. The diameter of the light-emitting elements ED may range from 30 nm to 700 nm, and the aspect ratio of the light-emitting elements ED may range from 1.2 to 100. It is, however, to be understood that the disclosure is not limited thereto. The light-emitting elements ED included in the display device 10 may have different diameters depending on compositional difference of the emissive layer 76. In an embodiment, the diameter of the light-emitting elements ED may be approximately 500 nm.

Hereinafter, processing steps of a method of fabricating a display device 10 according to an embodiment of the disclosure will be described. The processing steps of the method of fabricating the display device 10 will be described with reference to FIGS. 1 to 8. Redundant description will be omitted.

A method of fabricating a display device 10 according to an embodiment of the disclosure may include preparing a target substrate, the target substrate including a first substrate 11, a semiconductor layer disposed on the first substrate 11 and including multiple active layers ACT, a first gate conductive layer disposed on the semiconductor layer and including a scan line SCL and a sensing line SSL extended in a first direction DR1, multiple gate electrodes G1, G2 and G3 partially overlapping the semiconductor layer, and a first capacitor electrode CSE1, a first data conductive layer disposed on the first gate conductive layer and including a data line DTL, first and second electrodes of multiple transistors T1, T2 and T3, and a second capacitor electrode CSE2 overlapping the first capacitor electrode CSE1, a second data conductive layer disposed on the first data conductive layer and including a first voltage line VDL from which a first supply voltage is applied and a second voltage line VSL from which a second supply voltage is applied, and a first electrode 21 disposed on the second data conductive layer and extended in a second direction DR2 crossing the first direction DR1 and a second electrode 21 spaced apart from the first electrode 21 and extended in the second direction DR2. The method may further include aligning light-emitting elements ED such that their ends are disposed on the first electrode 21 and the second electrode 21 of the target substrate, respectively.

The first capacitor electrode CSE1 and the second capacitor electrode CSE2 may form a storage capacitor. The second capacitor electrode CSE2 may completely overlap the light-emitting elements ED in the thickness direction, and may partially overlap the first electrode 21 and the second electrode 21. During the process of aligning the light-emitting elements ED, a first alignment voltage may be applied to the second capacitor electrode CSE2, and a second alignment voltage different from the first alignment voltage may be applied to each of the electrodes 21.

Hereinafter, display devices according to other embodiments of the disclosure will be described.

Figure 11:
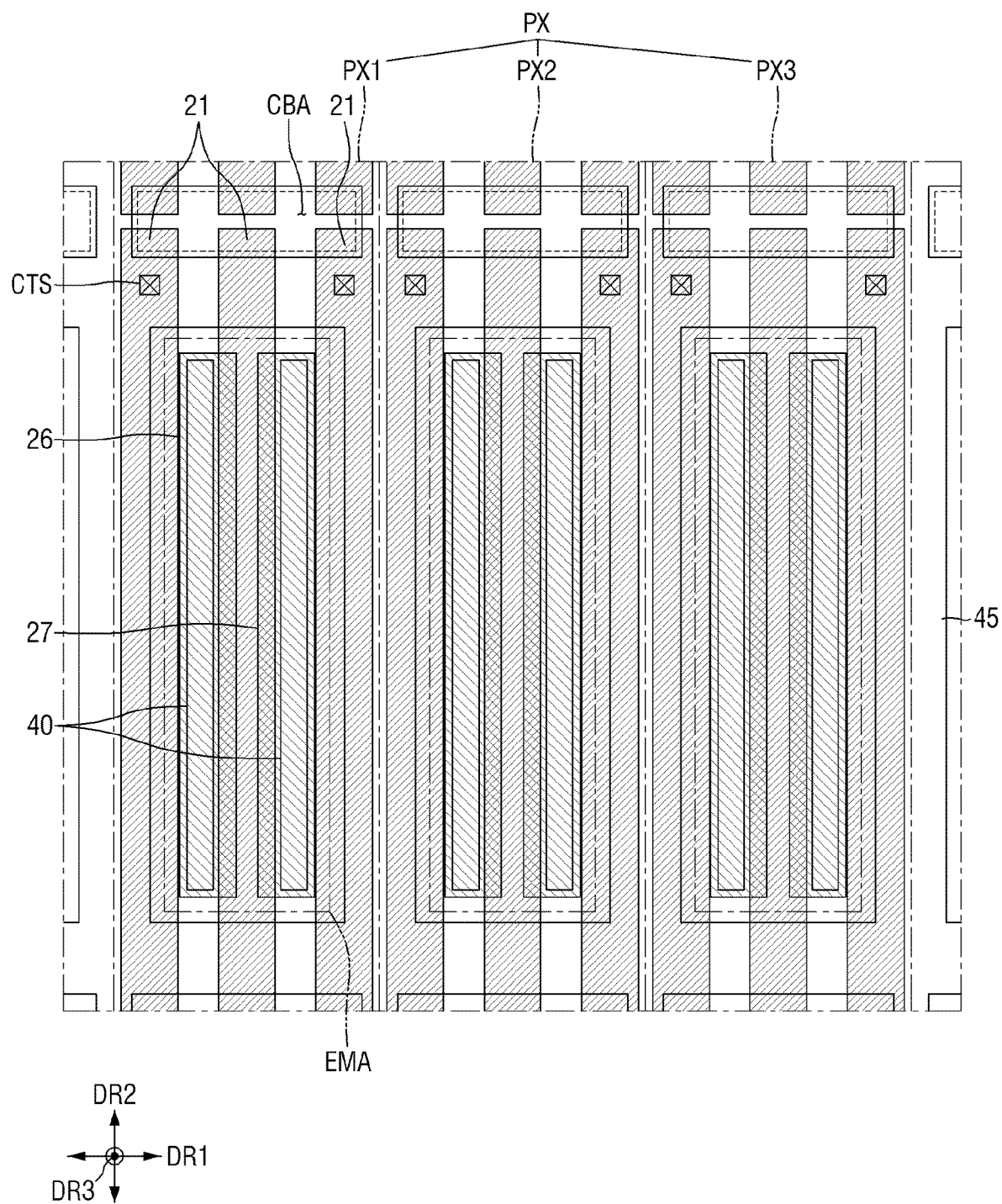
FIG. 11 is a plan view schematically showing multiple electrodes and banks included in a pixel of a display device according to another embodiment.

FIG. 11 is a plan view schematically showing electrodes and banks included in a pixel of a display device according to another embodiment.

A display device according to the embodiment of FIG. 11 may be different from the display device of FIG. 7 at least in that the former further includes a third electrode 21 between a first electrode 21 and a second electrode 21 in plan view.

More specifically, the third electrode 21 may be extended in the second direction DR2, and the electrodes 21 may be spaced apart from one another in the first direction DR1. Although not shown in the drawings, the third electrode 21 may also overlap the portion of the second bank 45 that is extended in the first direction DR1, and an electrode contact hole CTS may be formed where the third electrode 21 and the second bank 45 overlap each other. In the fabrication mode of the display device, the third electrode 21 may be connected to the second voltage line VSL through the electrode contact hole CTS. The third electrode 21 may include a conductive material having a high reflectance. For example, the third electrode 21 may include a metal such as silver (Ag), copper (Cu) and aluminum (Al) as the material having a high reflectance, and may be an alloy including aluminum (Al), nickel (Ni), lanthanum (La), etc. The third electrode 21 may reflect light that is emitted from the light-emitting element ED and travels toward the side surfaces of the first banks 40 toward the upper side of each of the sub-pixels PXn. It is, however, to be understood that the disclosure is not limited thereto. The third electrode 21 may further include a transparent conductive material. For example, each of the electrodes 21 may include a material such as indium tin oxide (ITO), indium zinc oxide (IZO) and/or indium tin zinc oxide (ITZO). In some embodiments, the third electrode 21 may have a structure in which one or more layers of a transparent conductive material and a metal layer having high reflectivity are stacked on one another, or may be made up of a single layer including them. For example, the third electrode 21 may have a stack structure such as ITO/silver (Ag)/ITO/, ITO/Ag/IZO, or ITO/Ag/ITZO/IZO.

The third electrode 21 may be utilized to form an electric field within the sub-pixel PXn to align the light-emitting elements ED. The light-emitting elements ED may be disposed between the first electrode 21 and the second electrode 21 and between the second electrode 21 and the third electrode 21 by an electric field formed between the first to third electrodes 21 and the second capacitor electrode CSE2 thereunder.

According to this embodiment, in the fabrication mode of the display device, the first alignment signal (or the first alignment voltage) may be applied to the second capacitor electrode CES2, the second alignment signal (or the second alignment voltage) may be applied to the electrodes 21, and certain electric field is formed between the second capacitor electrode CES2 and the electrodes 21 through the second alignment signal and the second alignment signal to align the light-emitting elements ED. In this manner, it may be possible to prevent a parasitic electric field from being formed between the first and/or second electrodes and other conductive layers located under the first electrode and the second electrode.

Figure 12:
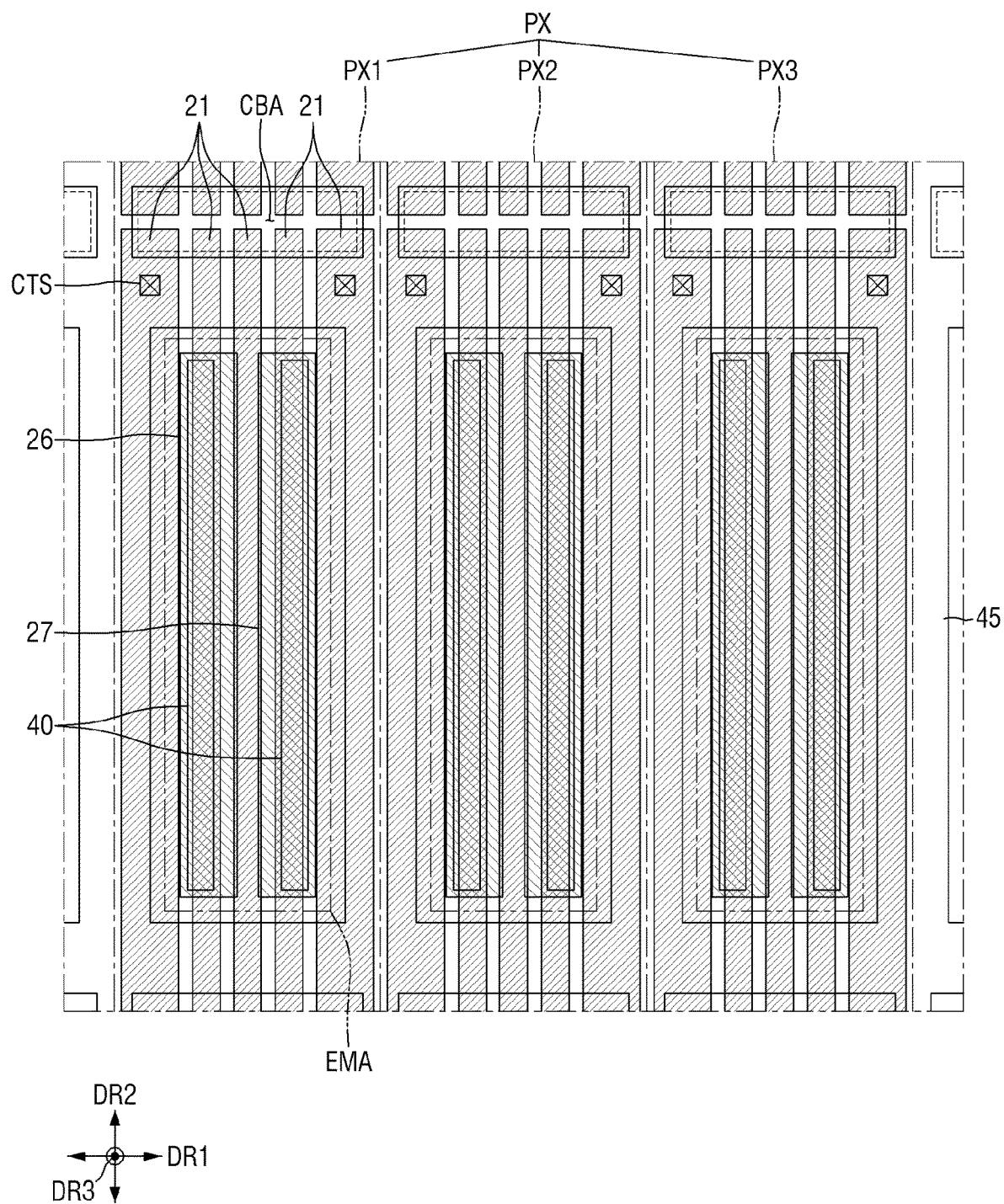
FIG. 12 is a plan view schematically showing multiple electrodes and banks included in a pixel of a display device according to yet another embodiment.

FIG. 12 is a plan view schematically showing electrodes and banks included in a pixel of a display device according to yet another embodiment.

The display device according to the embodiment of FIG. 12 may be different from the display device according to the embodiment of FIG. 11 at least in that a third electrode 21 may be comprised of multiple patterns. More specifically, the third electrode 21 may be comprised of three patterns. Each of the patterns may be extended along the second direction DR2 and may be spaced apart from one another in the first direction DR1.

Also according to this embodiment, in the fabrication mode of the display device, the first alignment signal (or the first alignment voltage) may be applied to the second capacitor electrode CES2, the second alignment signal (or the second alignment voltage) may be applied to the electrodes 21, and certain electric field may be formed between the second capacitor electrode CES2 and the electrodes 21 through the second alignment signal and the second alignment signal to align the light-emitting elements ED. In this manner, it may be possible to prevent a parasitic electric field from being formed between the first and/or second electrodes and other conductive layers located under the first electrode and the second electrode.

Figure 13:
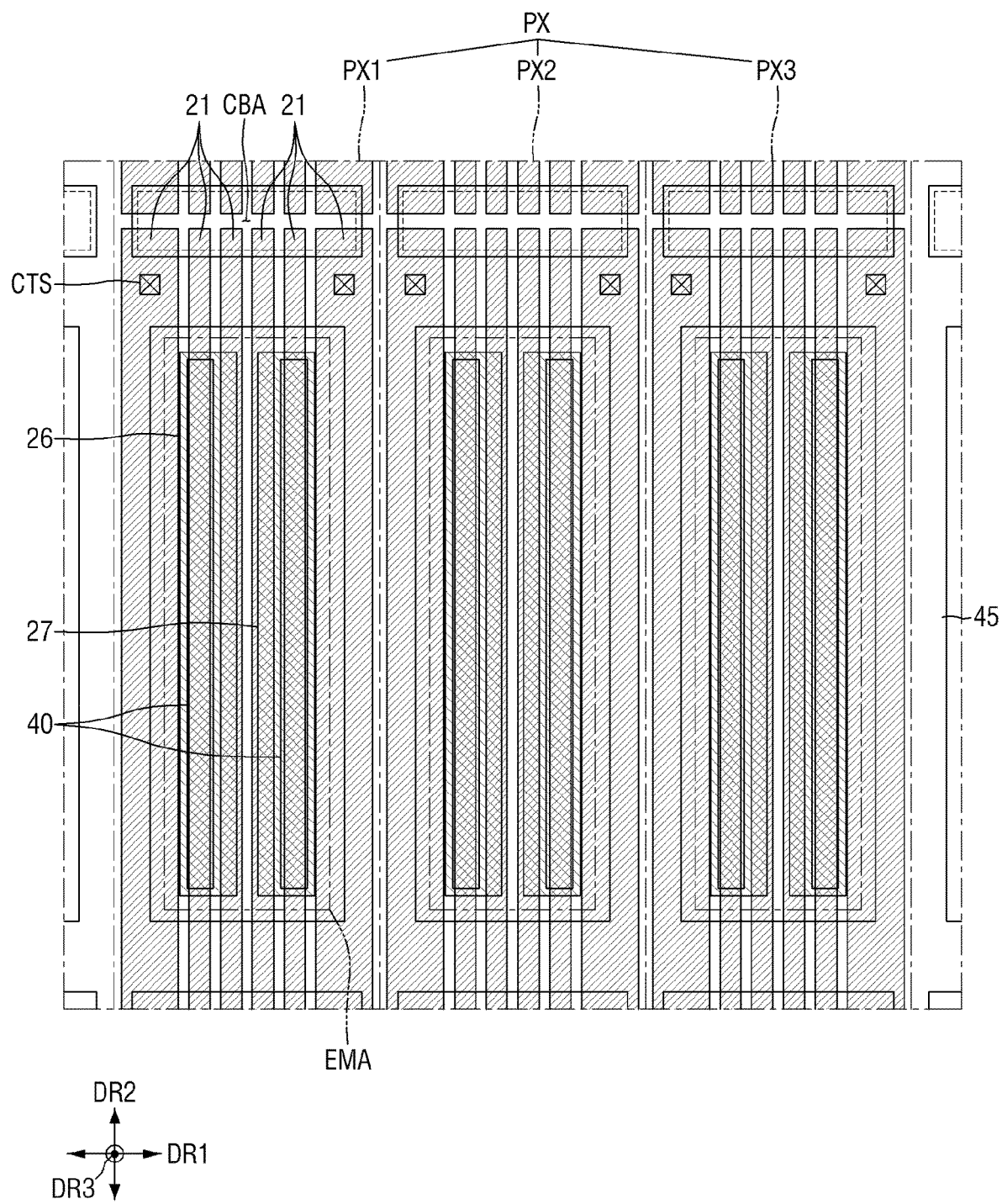
FIG. 13 is a plan view schematically showing multiple electrodes and banks included in a pixel of a display device according to yet another embodiment.

FIG. 13 is a plan view schematically showing electrodes and banks included in a pixel of a display device according to yet another embodiment.

The display device according to the embodiment of FIG. 13 may be different from the display device according to the embodiment of FIG. 12 at least in that a third electrode 21 is comprised of four patterns. More specifically, the third electrode 21 may be comprised of four patterns. Each of the patterns may be extended along the second direction DR2 and may be spaced apart from one another in the first direction DR1.

Also according to this embodiment, in the fabrication mode of the display device, the first alignment signal (or the first alignment voltage) may be applied to the second capacitor electrode CES2, the second alignment signal (or the second alignment voltage) may be applied to the electrodes 21, and certain electric field may be formed between the second capacitor electrode CES2 and the electrodes 21 through the second alignment signal and the second alignment signal to align the light-emitting elements ED. In this manner, it may be possible to prevent a parasitic electric field from being formed between the first and/or second electrodes and other conductive layers located under the first electrode and the second electrode.

Figure 14:
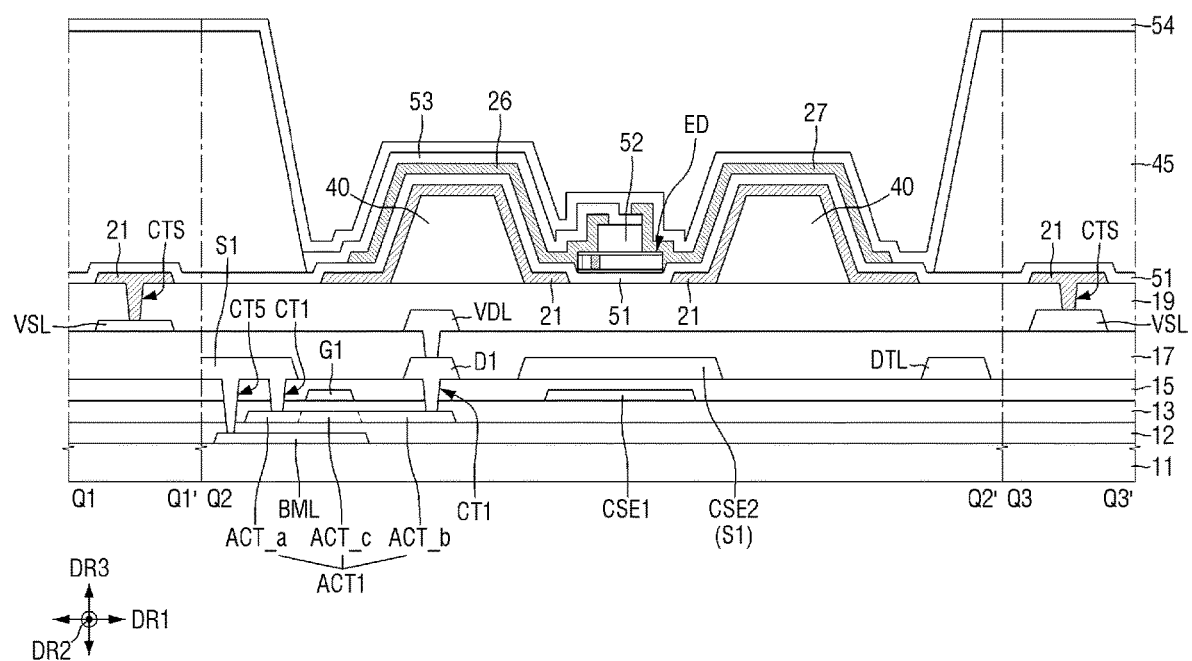
FIG. 14 is a cross-sectional view schematically showing a part of a display device according to yet another embodiment of the disclosure.

FIG. 14 is a cross-sectional view schematically showing a part of a display device according to yet another embodiment of the disclosure.

The display device according to the embodiment of FIG. 14 may be different from the display device according to the embodiment of FIG. 8 at least in that light-emitting elements 30 may not overlap a second electrode 21 thereunder. Ends of the light-emitting elements 30 may not overlap the second electrode 21 thereunder but may be spaced apart from it in plan view, and other ends of the light-emitting elements 30 may not overlap the second electrode 21 thereunder but may be spaced apart from it in plan view.

Other elements may be similar to or identical to those described above with reference to FIG. 8; and, therefore, the redundant description will be omitted.

Figure 15:
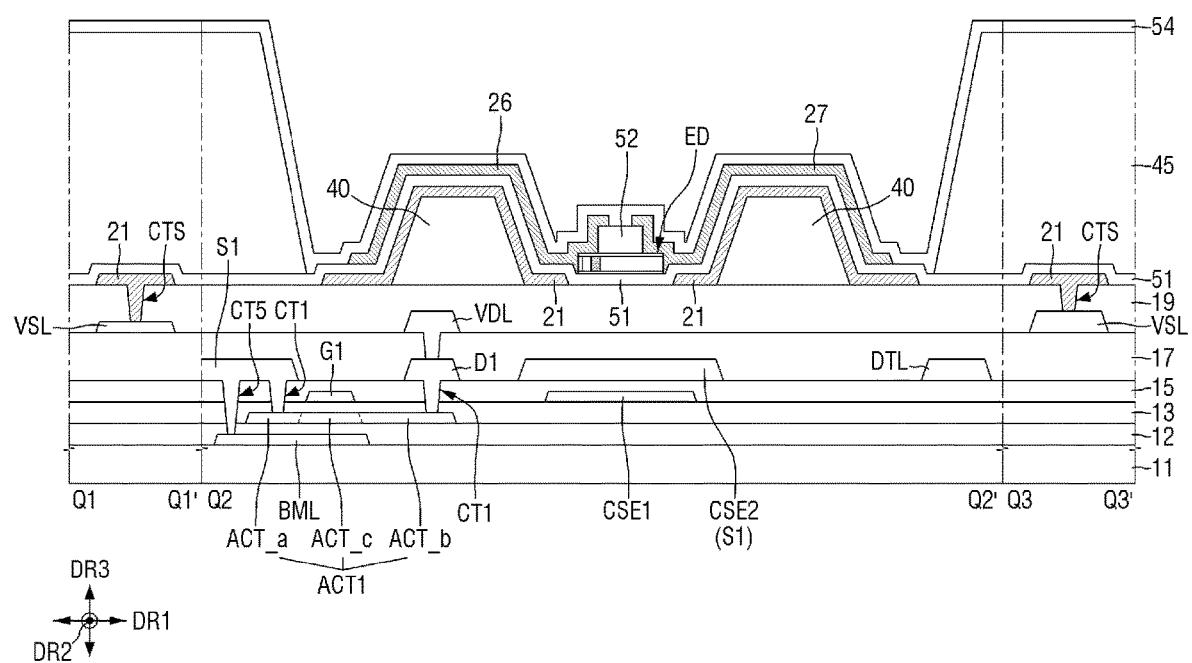
FIG. 15 is a cross-sectional view schematically showing a part of a display device according to yet another embodiment of the disclosure.

FIG. 15 is a cross-sectional view schematically showing a part of a display device according to yet another embodiment of the disclosure.

The display device according to the embodiment of FIG. 15 may be different from the display device according to the embodiment of FIG. 8 at least in that light-emitting elements 30 may not overlap a second electrode 21 thereunder. An end of the light-emitting elements 30 may not overlap the second electrode 21 thereunder but may be spaced apart from it in plan view, and the other end of the light-emitting elements 30 may not overlap the second electrode 21 thereunder but may be spaced apart from it in plan view.

The other elements may be similar or identical to those described above with reference to FIG. 9; and, therefore, redundant description will be omitted.

Figure 16:
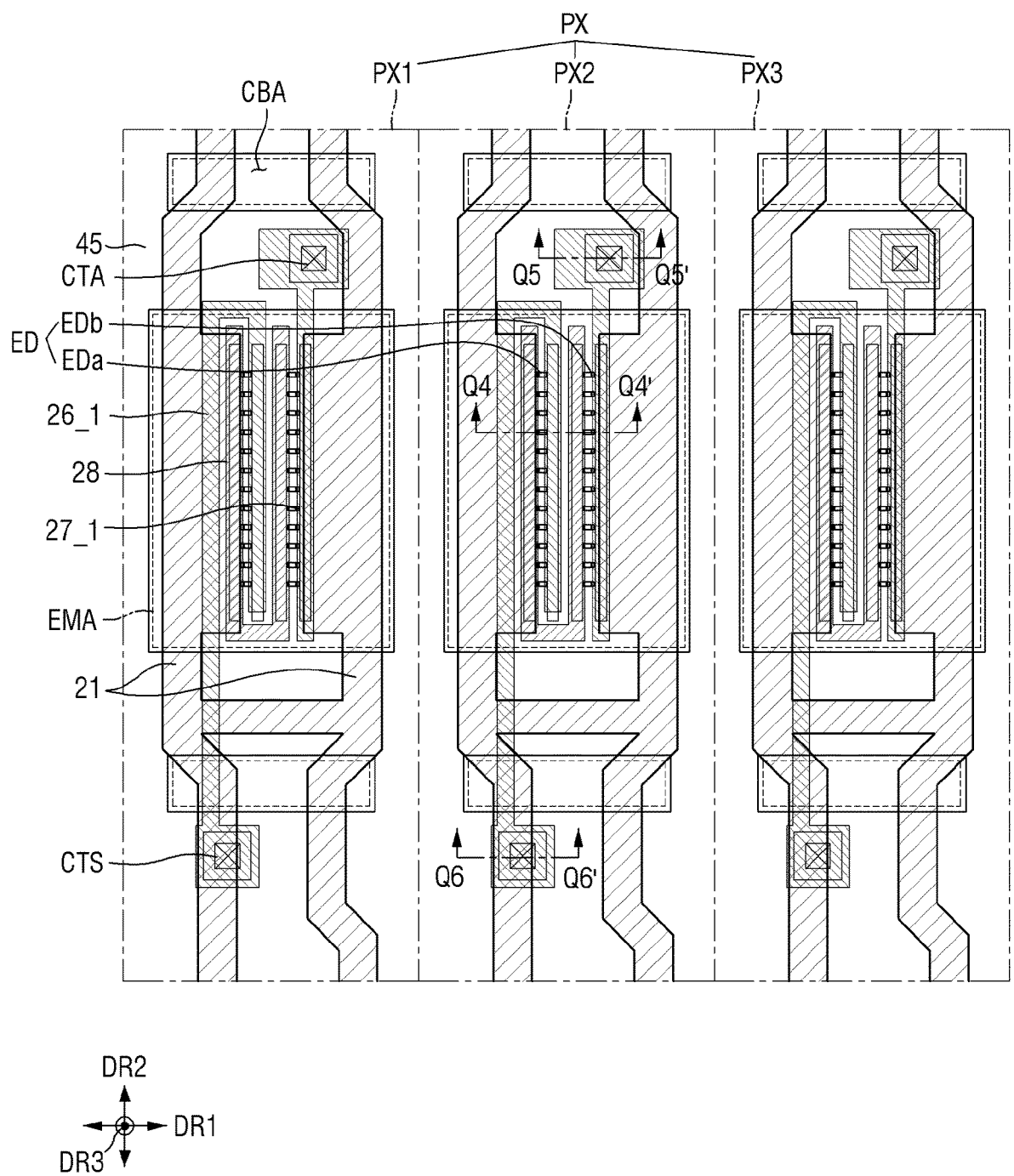
FIG. 16 is a plan view schematically showing multiple electrodes and light-emitting elements in a pixel of a display device according to yet another embodiment.
Figure 17:
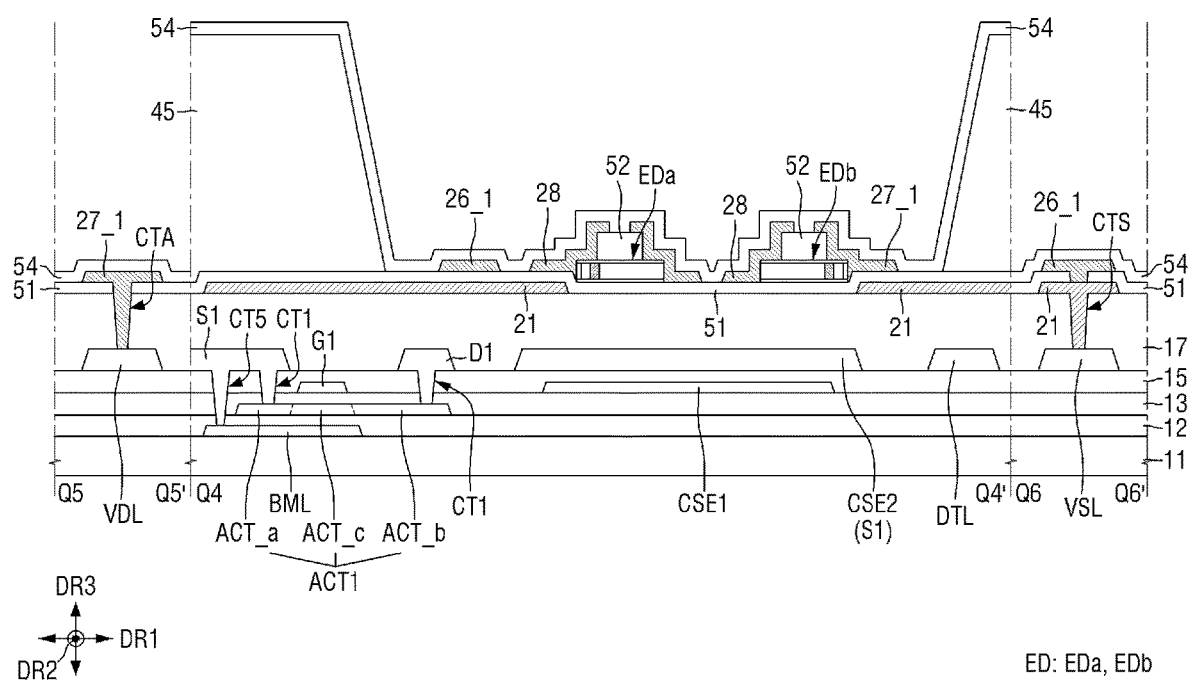
FIG. 17 is a schematic cross-sectional view taken along lines Q4-Q4', Q5-Q5' and Q6-Q6' of FIG. 16.

FIG. 16 is a plan view schematically showing electrodes and light-emitting elements in a pixel of a display device according to yet another embodiment. FIG. 17 is a schematic cross-sectional view taken along lines Q4-Q4', Q5-Q5' and Q6-Q6' of FIG. 16.

Referring to FIGS. 16 and 17, a display device according to this embodiment may be different from the display device of FIGS. 7 and 8 at least in that contact electrodes 26_1, 27_1 and 28 and light-emitting elements EDa and EDb are different. More specifically, the display device according to this embodiment may include the contact electrodes 26_1, 27_1 and 28 and the light-emitting elements EDa and EDb. The first contact electrode 26_1 may overlap the second electrode 21 on the opposite side in the first direction DR1. The second contact electrode 27_1 may overlap the second electrode 21 on a side in the first direction DR1. The first contact electrode 26_1 may include a (1-1) extension extended in the second direction DR2, a (1-2) extension bent from the (1-1) extension and extended in the first direction DR1, and a (1-3) extension bent again from the (1-2) extension in the second direction DR2 and extended toward the opposite side in the second direction DR2.

As shown in FIG. 16, the opposite end of the (1-1) extension in the second direction DR2 may overlap the second electrode 21 on the opposite side in the first direction DR1 and may be connected to the second voltage line VSL through the electrode contact hole CTS. According to this embodiment, the opposite end of the (1-1) extension in the second direction DR2 is connected to the second voltage line VSL, but the disclosure is not limited thereto. Another portion of the (1-1) extension may be connected to the second voltage line VSL.

As shown in FIG. 16, an end of the second contact electrode 27_1 on one side in the second direction DR2 may overlap the first voltage line VDL and may be connected to the first voltage line VDL through a electrode contact hole CTA. According to this embodiment, the end of the second contact electrode 27_1 on one side in the second direction DR2 overlaps the first voltage line VDL and is connected to the first voltage line VDL through the electrode contact hole CTA, but the disclosure is not limited thereto. Another portion of the second contact electrode 27_1 may overlap the first voltage line VDL and may be connected to the first voltage line VDL through the electrode contact hole CTA.

The third contact electrode 28 may include a (3-1) extension extended in the second direction DR2, a (3-2) extension bent from the (3-1) extension and extended in the first direction DR1, and a (3-3) extension bent again from the (3-2) extension and extended in the second direction DR2. The (3-1) extension may be disposed between the (1-1) extension and the (1-3) extension in plan view. The (3-3) extension may be disposed between the (1-3) extension and the second contact electrode 27_1 in plan view.

The light-emitting elements EDa and EDb may include first light-emitting elements EDa disposed between the (3-1) extension and the (1-3) extension in plan view, and second light-emitting elements EDb disposed between the (3-3) extension and the second contact electrode 27_1 in plan view. The light-emitting elements EDa and EDb may be arranged along the second direction DR2.

Figure 18:
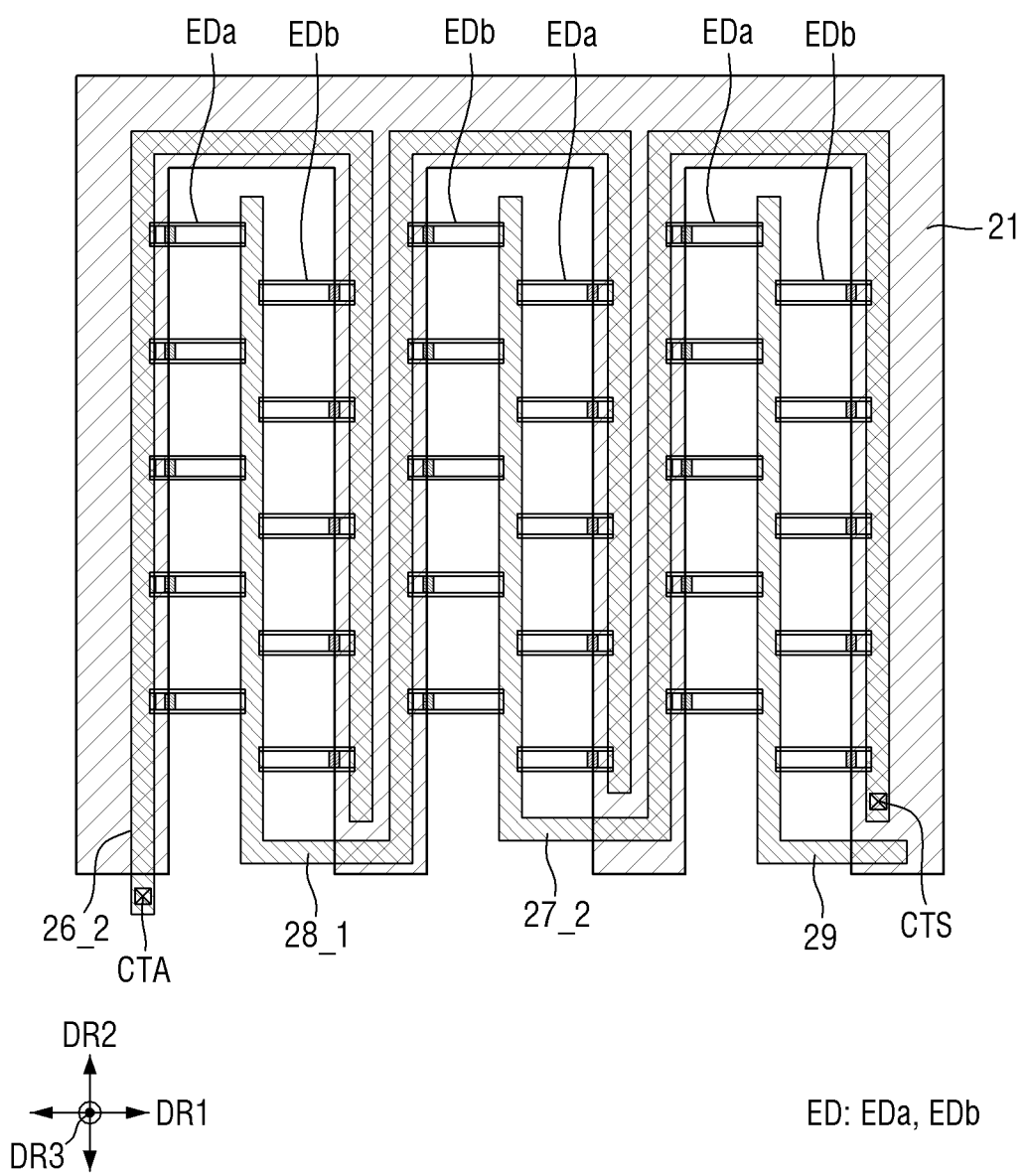
FIG. 18 is a plan view schematically showing multiple electrodes and light-emitting elements in a pixel of a display device according to yet another embodiment.

FIG. 18 is a plan view schematically showing electrodes and light-emitting elements in a pixel of a display device according to yet another embodiment. FIG. 18 shows electrodes and light-emitting elements disposed in one sub-pixel of one pixel.

A display device according to the embodiment of FIG. 18 may be different from the display device according to the embodiment of FIG. 16 at least in that a single sub-pixel includes four second electrodes 21 extended in the second direction DR2 and a second electrode 21 connected to the four second electrodes 21 and extended in the first direction DR1.

More specifically, the second electrodes 21 in the display device according to this embodiment may include four second electrodes 21 extended in the second direction DR2 and a second electrode 21 connected to the four second electrodes 21 and extended in the first direction DR1 in a single sub-pixel. Although the second electrode 21 extended in the first direction DR1 is connected to the end of each of the second electrodes 21 extended in the second direction DR2 on one side in the second direction DR2 in FIG. 18, the disclosure is not limited thereto. The second electrode 21 extended in the first direction DR1 may be connected to the opposite end of the second electrodes 21 extended in the second direction DR2. In the following description, the second electrodes 21 extended in the second direction DR2 will be referred to as a (2-1) electrode, a (2-2) electrode, a (2-3) electrode and a (2-4) electrode from the opposite side in the first direction DR1, respectively, and the second electrode 21 connected to the end of each of the second electrodes 21 extended in the second direction DR2 on one side in the second direction DR2 will be referred to as a (2-5) electrode.

The display device according to this embodiment may include contact electrodes 26_2, 27_2, 28_1 and 29. The first contact electrode 26_2 may overlap the (2-1) electrode, the (2-2) electrode and the (2-5) electrode. The (1-1) extension may overlap the (2-1) electrode, the (1-2) extension may overlap the (2-5) electrode, and the (1-3) extension may overlap the (2-2) electrode. The (1-1) extension may be connected to the first voltage line VDL (see FIG. 17) through the electrode contact hole CTA.

A second contact electrode 27_2 may include a (2-1) extension extended in the second direction DR2, a (2-2) extension bent from the (2-1) extension in the first direction DR1 and extended in the first direction DR1, a (2-3) extension bent from the (2-2) extension in a second direction DR2 and extended in the second direction DR2, a (2-4) extension bent from the (2-3) extension in the first direction DR1 and extended in the first direction DR1, and a (2-5) extension bent from the (2-4) extension in the second direction DR2 and extended in the second direction DR2. The (2-1) extension may be disposed between the (2-2) electrode and the (2-3) electrode in plan view, an end of the (2-2) extension in the first direction DR1 may overlap the (2-3) electrode, the (2-3) extension may overlaps the (2-3) electrode, the (2-4) extension may overlap the (2-5) electrode, and the (2-5) extension may overlap the (2-4) electrode. The (2-5) extension may be connected to the (2-4) electrode, and the (2-4) electrode may be connected to the second voltage line VSL (see FIG. 17) through the electrode contact hole CTS.

The (3-1) extension of the third contact electrode 28_1 may be disposed between the (2-1) electrode and the (2-2) electrode, an end of the (3-2) extension in the first direction DR1 may overlap the (2-2) electrode, and the (3-3) extension may overlap the (2-2) electrode. The third contact electrode 28_1 may further include a (3-4) extension bent from the (3-3) extension in the first direction DR1 and extended in the first direction DR1, and a (3-5) extension bent from the (3-4) extension in the second direction DR2 and extended in the second direction DR2. The (3-4) extension may overlap the (2-5) electrode, and the (3-5) extension may overlap the (2-3) electrode.

The fourth contact electrode 29 may include a (4-1) extension extended in the second direction DR2, and a (4-2) extension bent from the (4-1) extension in the first direction DR1 and extended in the first direction DR1. The (4-1) extension may be disposed between the (2-3) electrode and the (2-4) electrode in plan view, and an end of the (4-2) extension in the first direction DR1 may overlap the (2-4) electrode.

The light-emitting elements EDa and EDb may include first light-emitting elements EDa disposed between the (1-1) extension and the (3-1) extension, between the (2-1) extension and the (3-5) extension, between the (2-3) extension and the (4-1) extension, and second light-emitting elements EDb disposed between the (3-1) extension and the (1-3) extension, between the (3-3) extension and the (2-1) extension, and between the (4-1) extension and the (2-5) extension. The light-emitting elements EDa and EDb may be arranged along the second direction DR2.

Figure 19:
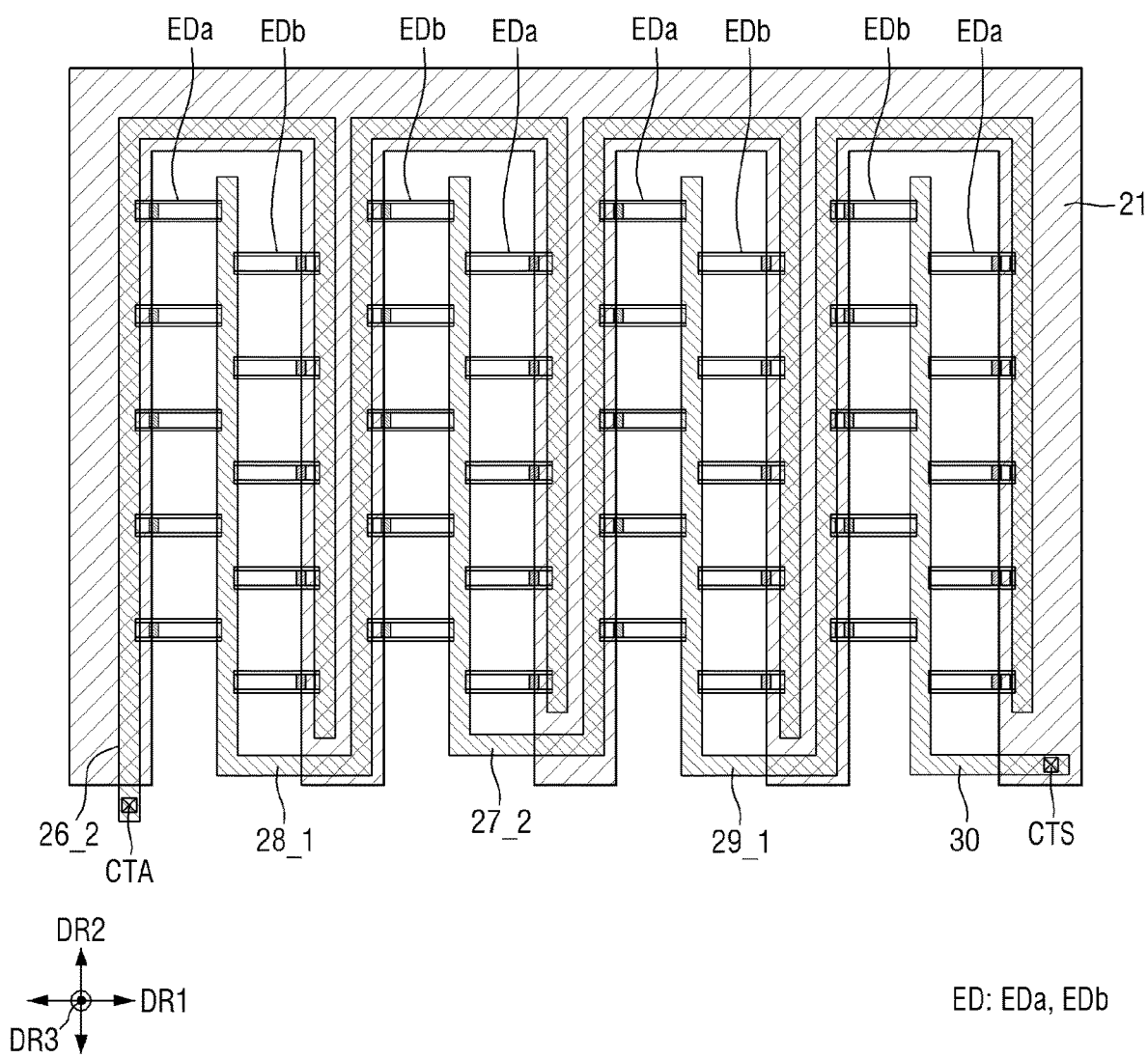
FIG. 19 is a plan view schematically showing multiple electrodes and light-emitting elements in a pixel of a display device according to yet another embodiment.

FIG. 19 is a plan view schematically showing electrodes and light-emitting elements in a pixel of a display device according to yet another embodiment.

A display device according to the embodiment of FIG. 19 may be different from the display device according to the embodiment of FIG. 18 at least in that a second electrode 21 further includes a (2-6) electrode spaced apart from the (2-4) electrode in the first direction DR1, and the display device further includes a fifth contact electrode 30.

More specifically, the (2-3) electrode and the (2-6) electrode may be spaced apart from each other with the (2-4) electrode therebetween. The opposite end of the (2-6) electrode in the second direction DR2 may be connected to the (2-5) electrode. The fourth contact electrode 29_1 may include a (4-3) extension bent from the (4-2) extension in the second direction DR2 and extended in the second direction DR2, a (4-4) extension bent from the (4-3) extension in the first direction DR1 and extended in the first direction DR1, and a (4-5) extension bent from the (4-4) extension in the second direction DR2 and extended in the second direction DR2. The (4-3) extension may overlap the (2-4) electrode, the (4-4) extension may overlap the (2-5) electrode, and the (4-5) extension may overlap the (2-6) electrode. The fifth contact electrode 30 may include a (5-1) extension extended in the second direction DR2, and a (5-2) extension bent from the (5-1) extension in the first direction DR1 and extended in the first direction DR1. The (5-1) extension may be disposed between the (4-3) extension and the (4-5) extension in plan view. An end of the (5-2) extension in the first direction DR1 may overlap the (2-6) electrode.

Moreover, the (2-5) extension of the second contact electrode 27_2 may not be connected to the second voltage line VSL through the electrode contact hole CTS unlike in FIG. 18, but the (5-2) extension of the fifth contact electrode 30 may be connected to the (2-6) electrode and the (2-6) electrode may be connected to the second voltage line VSL.

The first light-emitting elements EDa may be further disposed between the (5-1) extension and the (4-5) extension, and the second light-emitting elements EDb may be further disposed between the (4-3) extension and the (5-1) extension.

The other elements may be similar or identical to those described above with reference to FIG. 18; and, therefore, redundant description will be omitted.

Figure 20:
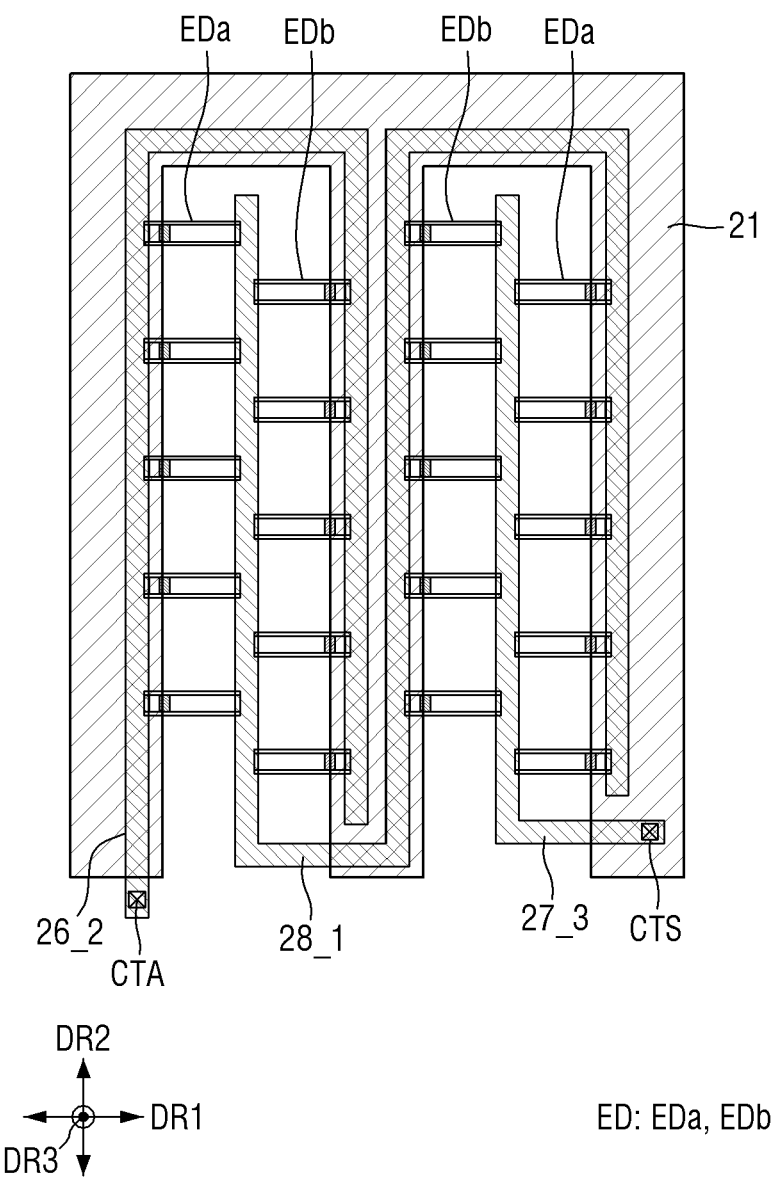
FIG. 20 is a plan view schematically showing multiple electrodes and light-emitting elements in a pixel of a display device according to yet another embodiment.

FIG. 20 is a plan view schematically showing electrodes and light-emitting elements in a pixel of a display device according to yet another embodiment.

A display device according to the embodiment of FIG. 20 may be different from the display device according to the embodiment of FIG. 18 at least in that a second electrode 21 does not include the 2-4 electrode, and a second electrode 27_3 includes only the 2-1 extension and the (2-2) extension.

The (2-2) extension may be connected to the (2-3) electrode, and the (2-3) electrode may be connected to the second voltage line VSL (see FIG. 17) through the electrode contact hole CTS.

The other elements may be similar to identical to those described above with reference to FIG. 18; and, therefore, the redundant description will be omitted.

Figure 21:
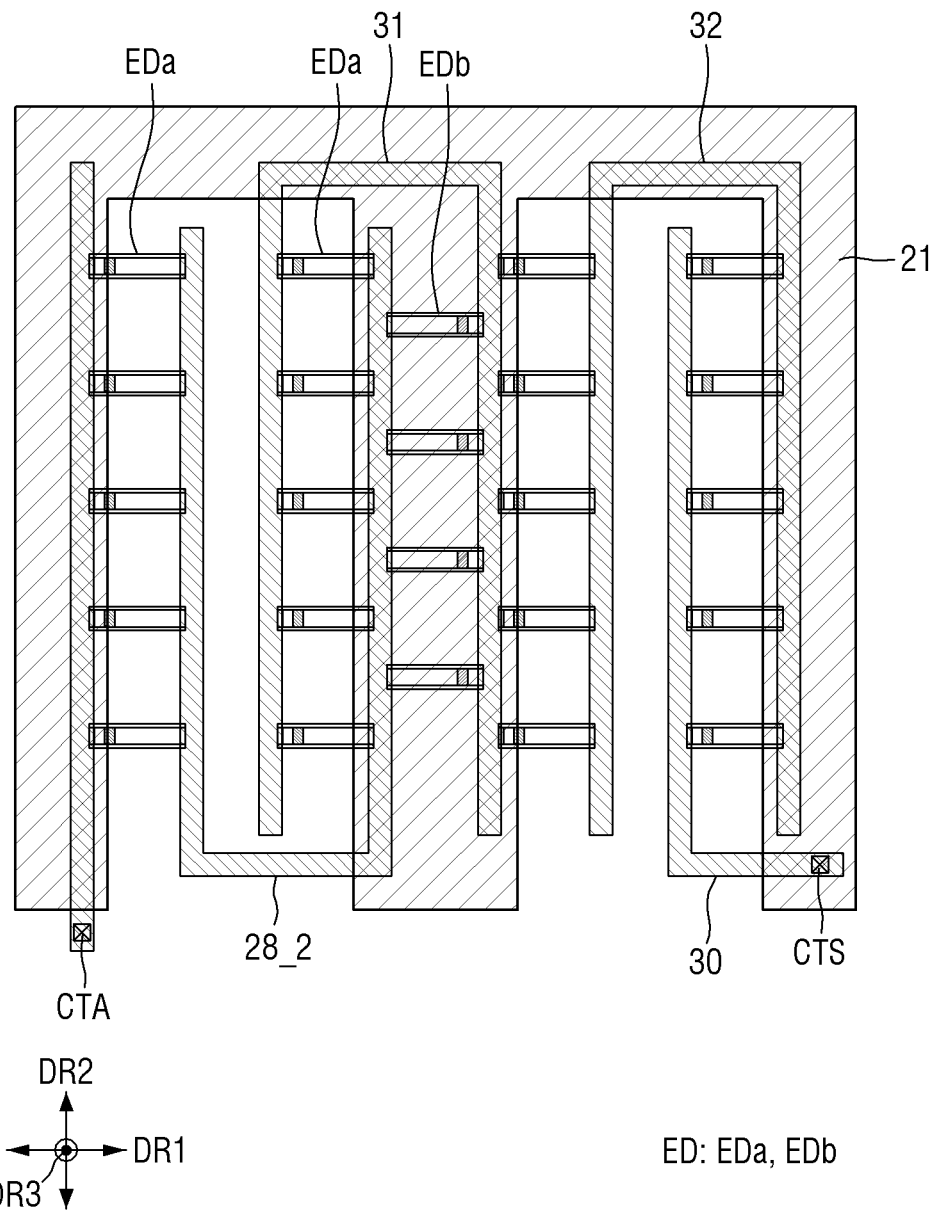
FIG. 21 is a plan view schematically showing multiple electrodes and light-emitting elements in a pixel of a display device according to yet another embodiment.

FIG. 21 is a plan view schematically showing electrodes and light-emitting elements in a pixel of a display device according to yet another embodiment.

A display device according to the embodiment of FIG. 21 may be different from the display device according to the embodiment of FIG. 18 at least in that a first contact electrode includes only the (1-1) extension, and a third contact electrode 28_2 includes only the (3-1) extension, the (3-2) extension, and the (3-3) extension. More specifically, in the display device according to this embodiment, the second electrode 21 may include only the (2-1) to (2-4) electrodes, like the display device of FIG. 20. The display device according to this embodiment may further include sixth and seventh contact electrodes 31 and 32. The sixth contact electrode 31 may include a (6-1) extension extended in the second direction DR2, a (6-2) extension bent in the first direction DR1 from the (6-1) extension and extended in the first direction DR1, and a (6-3) extension bent in the second direction DR2 from the (6-2) extension and extended along the second direction DR2. The seventh contact electrode 32 may include a (7-1) extension extended in the second direction DR2, a (7-2) extension bent in the first direction DR1 from the (7-1) extension and extended in the first direction DR1, and a (7-3) extension bent in the second direction DR2 from the (7-2) extension and extended in the second direction DR2. The (6-1) extension may be disposed between the (3-1) extension and the (3-3) extension in plan view, the (6-2) extension may overlap the (2-5)electrode, the (6-3) extension may overlaps the (2-2) electrode, and the (6-3) extension may be disposed between the (3-3) extension and the (7-1) extension in plan view. The (7-1) extension may be disposed between the (6-3) extension and the (5-1) extension in plan view, the (7-2) extension may overlap the (2-5) electrode, and the (7-3) extension may overlap the (2-3) electrode. The (5-1) extension may be disposed between the (2-2) electrode and the (2-3) electrode, and an end of the (5-2) extension in the first direction DR1 may overlap the (2-3) electrode. An end of the (5-2) extension in the first direction DR1 may be connected to the (2-3) electrode, and the (2-3) electrode may be connected to the second voltage line VSL (see FIG. 17) through the electrode contact hole CTS.

The first light-emitting elements EDa may be disposed between the first contact electrode 26_3 and the (3-1) extension, between the (6-1) extension and the (3-3) extension, and between the (5-1) extension and the (7-3) extension. The second light-emitting elements EDb may be disposed between the (3-3) extension and the (6-3) extension. The light-emitting elements EDa and EDb may be arranged along the second direction DR2.

The other elements may be similar or identical to those described above with reference to FIGS. 19 and 20; and, therefore, redundant description will be omitted.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:

1. A display device comprising:
   a semiconductor layer disposed on a first substrate and comprising active layers;
   a first gate conductive layer disposed on the semiconductor layer and comprising a scan line and a sensing line extended in a first direction, gate electrodes partially overlapping the semiconductor layer, and a first capacitor electrode;
   a first data conductive layer disposed on the first gate conductive layer and comprising a data line, first and second electrodes of transistors, and a second capacitor electrode overlapping the first capacitor electrode;
   a second data conductive layer disposed on the first data conductive layer and comprising a first voltage line from which a first supply voltage is applied and a second voltage line from which a second supply voltage is applied;
   a first electrode disposed on the second data conductive layer and extended in a second direction intersecting the first direction and a second electrode spaced apart from the first electrode and extended in the second direction; and
   light-emitting elements each having an end disposed on the first electrode and an end disposed on the second electrode, wherein
   the first capacitor electrode and the second capacitor electrode forms a storage capacitor,
   the second capacitor electrode completely overlaps the light-emitting elements in a thickness direction, and partially overlaps the first electrode and the second electrode, and
   a first alignment voltage is applied to the second capacitor electrode in a fabrication mode of the display device.

2. The display device of claim 1, wherein
   the transistors comprises a first transistor, and
   the first transistor includes:
      a first electrode electrically connected to a first end of each of the light-emitting elements; and
      a second electrode electrically connected to the first voltage line.

3. The display device of claim 2, wherein the storage capacitor is electrically connected to a gate electrode and the first electrode of the first transistor.

4. The display device of claim 3, wherein
   the first capacitor electrode is electrically connected to the gate electrode of the first transistor, and
   the second capacitor electrode is connected to the first electrode of the first transistor so that the first alignment voltage is applied to the first transistor.

5. The display device of claim 3, wherein
   the transistors further comprises a second transistor, and
   the second transistor includes:
      a first electrode electrically connected to the gate electrode of the first transistor; and
      a second electrode electrically connected to the data line.

6. The display device of claim 5, further comprising:
   a scan line from which a scan signal is applied and that is electrically connected to a gate electrode of the second transistor; and
   a sensing line from which a sensing signal is applied.

7. The display device of claim 6, wherein the first data conductive layer further comprises an initialization voltage line extended in the second direction to apply an initialization voltage.

8. The display device of claim 7, wherein
   the transistors comprise a third transistor, and
   the third transistor includes:
      a gate electrode electrically connected to the sensing line;
      a first electrode electrically connected to the first end of each of the light-emitting elements; and
      a second electrode electrically connected to the initialization voltage line.

9. The display device of claim 4, wherein a second alignment voltage is applied to the first electrode and the second electrode in the fabrication mode.

10. The display device of claim 9, wherein the first electrode is electrically connected to the second voltage line in the fabrication mode.

11. The display device of claim 10, wherein the second electrode is electrically connected to the second voltage line in the fabrication mode.

12. The display device of claim 11, further comprising:
    a first interlayer dielectric layer between the first data conductive layer and the second data conductive layer; and
    a first planarization layer disposed between the second data conductive layer and the first and second electrodes.

13. The display device of claim 12, wherein the first electrode and the second electrode are electrically connected to the second voltage line through contact holes penetrating the first planarization layer.

14. The display device of claim 9, further comprising:
    a third electrode disposed on a same layer as the first electrode and extended in the second direction, wherein
    the third electrode is disposed between the first electrode and the second electrode in a plan view, and
    a same alignment voltage as an alignment voltage of the first electrode is applied to the third electrode.

15. The display device of claim 14, wherein the third electrode comprises patterns spaced apart from one another in the first direction.

16. A method of fabricating a display device, the method comprising:
    preparing a target substrate, the target substrate comprising:
       a first substrate;
       a semiconductor layer disposed on the first substrate and comprising active layers;
       a first gate conductive layer disposed on the semiconductor layer and comprising a scan line and a sensing line extended in a first direction, gate electrodes partially overlapping the semiconductor layer, and a first capacitor electrode;

a first data conductive layer disposed on the first gate conductive layer and comprising a data line, first and second electrodes of transistors, and a second capacitor electrode overlapping the first capacitor electrode;

a second data conductive layer disposed on the first data conductive layer and comprising a first voltage line from which a first supply voltage is applied and a second voltage line from which a second supply voltage is applied; and a first electrode disposed on the second data conductive layer and extended in a second direction intersecting the first direction and a second electrode spaced apart from the first electrode and extended in the second direction, aligning light-emitting elements such that ends are disposed on the first electrode and the second electrode of the target substrate, wherein the first capacitor electrode and the second capacitor electrode forms a storage capacitor, the second capacitor electrode completely overlaps the plurality of light-emitting elements in a thickness direction, and partially overlaps the first electrode and the second electrode, and the aligning of the light-emitting elements comprises applying a first alignment voltage to the second capacitor electrode.

17. The method of claim 16, wherein the aligning of the light-emitting elements comprises applying a second alignment voltage to the first electrode and the second electrode.

18. The method of claim 17, wherein the first electrode is electrically connected with the second voltage line while the light-emitting elements are aligned.

19. The method of claim 18, wherein the second electrode is electrically connected with the second voltage line while the light-emitting elements are aligned.

20. The method of claim 19, wherein the display device comprises a third electrode disposed on a same layer as the first electrode and extended in the second direction, the third electrode is disposed between the first electrode and the second electrode in a plan view, and the aligning of the light-emitting elements comprises applying a same alignment voltage as that of the first electrode to the third electrode.

* * * * *